(12) United States Patent
Lee

(10) Patent No.: US 9,231,128 B2
(45) Date of Patent: Jan. 5, 2016

(54) SOLAR CELL MODULE

(75) Inventor: Youngsik Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 934 days.

(21) Appl. No.: 12/976,505

(22) Filed: Dec. 22, 2010

(65) Prior Publication Data

US 2012/0042924 A1 Feb. 23, 2012

(30) Foreign Application Priority Data

Aug. 20, 2010 (KR) .................. 10-2010-0080675

(51) Int. Cl.
*H01L 31/0224* (2006.01)
*H01L 31/02* (2006.01)
*H01L 31/05* (2014.01)

(52) U.S. Cl.
CPC .. *H01L 31/022425* (2013.01); *H01L 31/02013* (2013.01); *H01L 31/0512* (2013.01); *Y02E 10/50* (2013.01)

(58) Field of Classification Search
CPC ................. H01L 31/022425; H01L 31/02013; H01L 31/0512
See application file for complete search history.

(56) References Cited

U.S. PATENT DOCUMENTS

| | | | | |
|---|---|---|---|---|
| 5,431,803 A * | 7/1995 | DiFranco et al. | ................ | 205/50 |
| 2003/0111103 A1 * | 6/2003 | Bower et al. | .................. | 136/244 |
| 2008/0083453 A1 | 4/2008 | Rose et al. | | |
| 2008/0121266 A1 * | 5/2008 | Tsunomura et al. | .......... | 136/244 |
| 2009/0032081 A1 * | 2/2009 | Saita et al. | .................... | 136/244 |

FOREIGN PATENT DOCUMENTS

| | | |
|---|---|---|
| CN | 1886840 A | 12/2006 |
| EP | 2058868 A1 | 5/2009 |
| EP | 2068372 A1 | 6/2009 |
| JP | 2009-218315 A | 9/2009 |

OTHER PUBLICATIONS

Pan, Effect of Reflow Profile on SnPb and SnAgCu Solder Joint Shear Force.*
Wayback Machine citation for Pan, Effect of Reflow Profile on SnPb and SnAgCu Solder Joint Shear Force.*

* cited by examiner

*Primary Examiner* — Shannon Gardner
(74) *Attorney, Agent, or Firm* — Birch, Stewart, Kolasch & Birch, LLP

(57) ABSTRACT

A solar cell module is discussed. The solar cell module includes a plurality of solar cells, each solar cell including a substrate and an electrode part positioned at a surface of the substrate, an interconnector electrically connecting at least one of the solar cells to another of the solar cells; and a first conductive adhesive film including a first resin and a plurality of first conductive particles dispersed in the first resin. The first conductive adhesive film is positioned between the electrode part of the at least one solar cell and the interconnector to electrically connect the electrode part of the at least one solar cell to the interconnector. A contact surface between the first conductive particles and the interconnector is an uneven surface.

20 Claims, 20 Drawing Sheets

SOLAR CELL MODULE

This application claims priority to and the benefit of Korean Patent Application No. 10-2010-0080675 filed in the Korean Intellectual Property Office on Aug. 20, 2010, the entire contents of which are incorporated herein by reference.

BACKGROUND OF THE INVENTION

1. Field of the Invention

Example embodiments of the invention relate to a solar cell module in which adjacent solar cells are electrically connected to one another using an interconnector.

2. Description of the Related Art

Solar power generation to convert light energy into electric energy using a photoelectric transformation effect has been widely used as a method for obtaining eco-friendly energy. A solar power generation system using a plurality of solar cell panels has been installed in places, such as houses due to an improvement in a photoelectric transformation efficiency of solar cells.

In a solar cell module, power produced by the solar cells may be output to the outside of the solar cell module by connecting a conductive element (for example, an interconnector) connected to an anode and a cathode of each of the solar cells, to lead wires to provide an extension of the conductive element to the outside of the solar cell module. Further, current may be output through a power supply line of a junction box by connecting the lead wires to the junction box.

SUMMARY OF THE INVENTION

In one aspect, there is a solar cell module comprising a plurality of solar cells, each solar cell including a substrate and an electrode part positioned at a surface of the substrate, an interconnector configured to electrically connect at least one of the plurality of solar cells to another of the plurality of solar cells, and a first conductive adhesive film including a first resin and a plurality of first conductive particles dispersed in the first resin, the first conductive adhesive film being positioned between the electrode part of the at least one of the plurality of solar cells and the interconnector to electrically connect the electrode part of the at least one of the plurality of solar cells to the interconnector, wherein a contact surface between the plurality of first conductive particles and the interconnector is an uneven surface.

A portion of at least one of the plurality of first conductive particles may be embedded in the interconnector. The contact surface may have the same surface shape as the portion of the at least one first conductive particle embedded in the interconnector.

The plurality of first conductive particles may be formed of metal-coated resin particles with the metal containing at least one metal selected among copper (Cu), silver (Ag), gold (Au), iron (Fe), nickel (Ni), lead (Pb), zinc (Zn), cobalt (Co), titanium (Ti), and magnesium (Mg) as a main component. Alternatively, the plurality of first conductive particles may be formed of metal particles containing at least one metal selected among copper (Cu), silver (Ag), gold (Au), iron (Fe), nickel (Ni), lead (Pb), zinc (Zn), cobalt (Co), titanium (Ti), and magnesium (Mg).

When the first conductive particles are formed of the metal-coated resin particles, the contact surface between the first conductive particles and the interconnector may be a curved surface.

The interconnector may include a conductive metal that is formed of a lead-free material containing an amount of lead (Pb) equal to or less than about 1,000 ppm, and a solder that is coated on a surface of the conductive metal using a material containing lead. Alternatively, the interconnector may include a conductive metal formed of a lead-free material containing an amount of lead (Pb) equal to or less than about 1,000 ppm.

A width of the portion of the at least one first conductive particle embedded in the interconnector may be equal to or less than about 2 μm. A surface of the electrode part contacting the first conductive particles is a flat surface or an uneven surface having a plurality of uneven portions.

The electrode part may include a plurality of front electrodes positioned at the surface of the substrate. The first conductive adhesive film may be positioned on the plurality of front electrodes in a direction crossing the plurality of front electrodes.

Further, the electrode part may include a plurality of front electrodes positioned at the surface of the substrate and a plurality of front electrode current collectors positioned to cross the plurality of front electrodes. The first conductive adhesive film may be positioned on the plurality of front electrode current collectors in a direction parallel to the plurality of front electrode current collectors.

Further, a back electrode and a back electrode current collector may be positioned at a back surface opposite the surface of the substrate. The first conductive adhesive film may contact the back electrode current collector in a direction parallel to the back electrode current collector.

The solar cell module may further include a lead wire configured to electrically connect the interconnector to a junction box, and a second conductive adhesive film positioned between the interconnector and the lead wire.

A contact surface between second conductive particles of the second conductive adhesive film, the interconnector, and the lead wire may be an uneven surface.

Each of the interconnector and the lead wire may include a conductive metal that is formed of a lead-free material containing an amount of lead (Pb) equal to or less than about 1,000 ppm, and a solder that is coated on a surface of the conductive metal using a material containing lead. Alternatively, each of the interconnector and the lead wire may include a conductive metal formed of a lead-free material containing an amount of lead (Pb) equal to or less than about 1,000 ppm. The interconnector and the lead wire may be formed of different materials.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
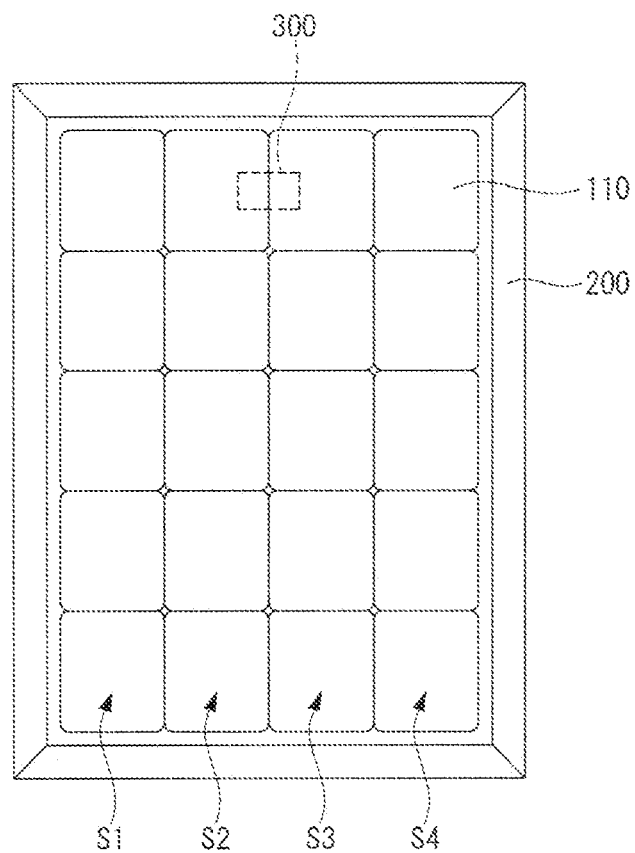
FIG. 1 is a plane view of a solar cell module according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
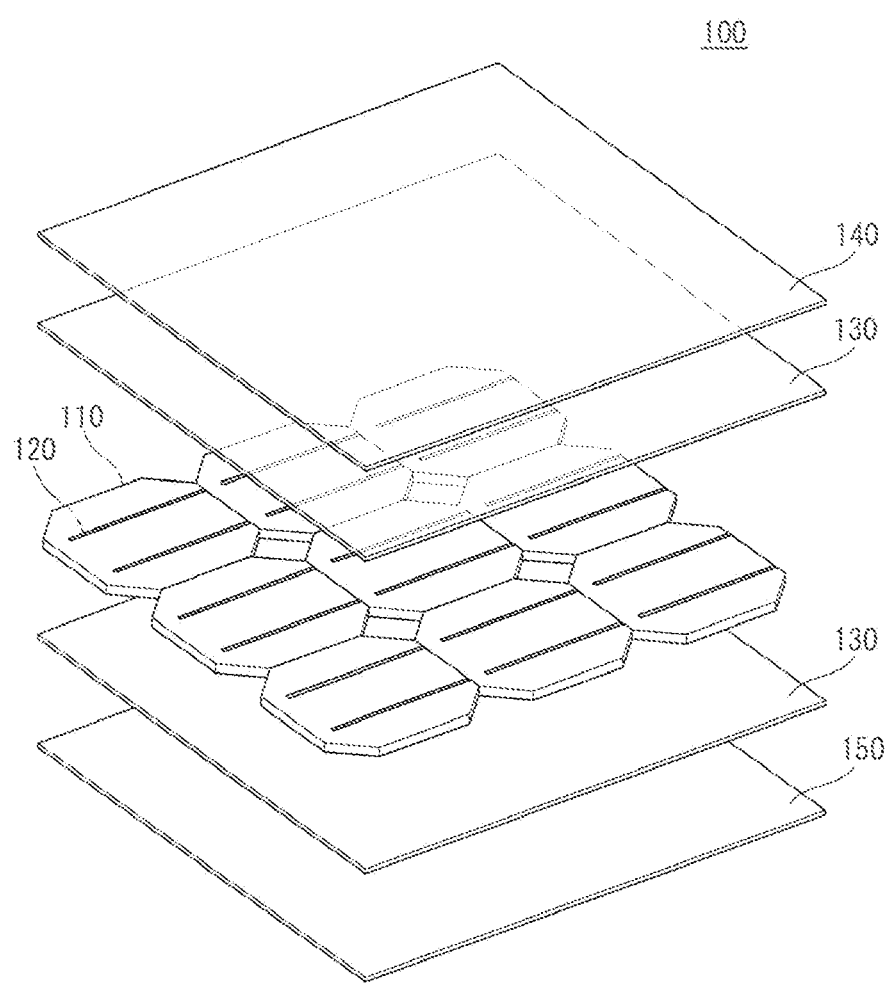
FIG. 2 is an exploded perspective view of a solar cell panel shown in FIG. 1.
Figure 3:
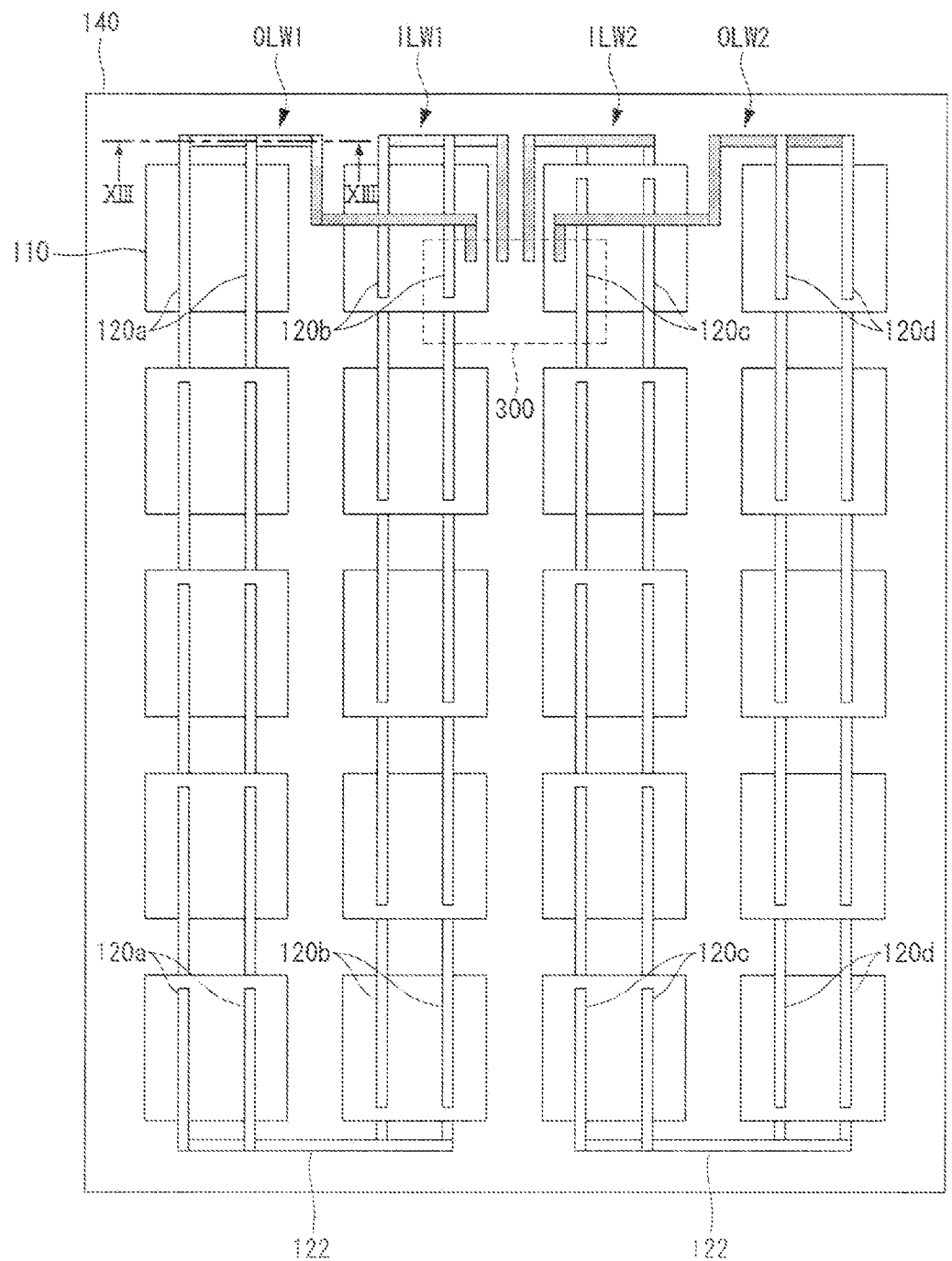
FIG. 3 is a back view of the solar cell panel shown in FIG. 1.
Figure 4:
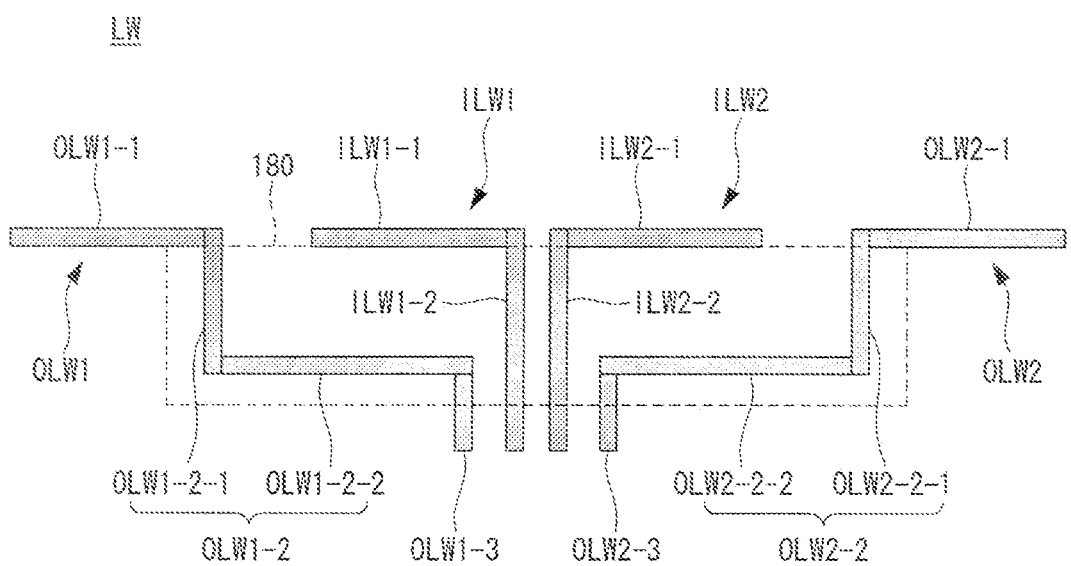
FIG. 4 is an enlarged view of lead wires shown in FIG. 3.

FIG. 1 is a plane view of a solar cell in a solar cell module according to an example embodiment of the invention. FIG. 2 is an exploded perspective view of a solar cell in a solar cell panel (module) shown in FIG. 1. FIG. 3 is a back view of a solar cell in the solar cell panel (module) shown in FIG. 1. FIG. 4 is an enlarged view of lead wires shown in FIG. 3.

A solar cell module according to an example embodiment of the invention includes a solar cell panel 100.

As shown in FIG. 2, the solar cell panel 100 includes a plurality of solar cells 110, interconnectors 120 for electrically connecting the solar cells 110 to one another, a plurality of protective layers 130 for protecting the solar cells 110, a transparent member 140 positioned on the protective layer 130 on light receiving surfaces of the solar cells 110, and a back sheet 150 that is positioned under the protective layer 130 on surfaces opposite the light receiving surfaces of the solar cells 110 and is formed of an opaque material.

As shown in FIG. 1, the solar cell module includes a frame 200 receiving the components 110, 120, 130, 140, and 150 that form an integral body through a lamination process, and a junction box 300 for collecting electric power produced by the solar cells 110.

The back sheet 150 prevents moisture or oxygen from penetrating into a back surface of the solar cell panel 100, thereby protecting the solar cells 110 from an external environment. The back sheet 150 may have a multi-layered structure including a moisture/oxygen penetrating prevention layer, a chemical corrosion prevention layer, a layer having insulating characteristics, etc.

The protective layers 130 and the solar cells 110 form an integral body when a lamination process is performed in a state where the protective layers 130 are respectively positioned on and under the solar cells 110. The protective layers 130 prevent corrosion of metal resulting from the moisture penetration and protect the solar cells 110 from an impact. The protective layers 130 may be formed of a material such as ethylene vinyl acetate (EVA). Other materials may be used.

The transparent member 140 on the protective layer 130 is formed of a tempered glass having a high light transmittance and excellent damage prevention characteristic. The tempered glass may be a low iron tempered glass containing a small amount of iron. The transparent member 140 may have an embossed inner surface so as to increase a scattering effect of light.

An electrical connection structure of the solar cell panel 100 of the solar cell module according to the example embodiment of the invention is described in detail with reference to FIGS. 2 to 4. FIG. 3 depicts an enlarged view of a distance between the solar cells 110. The solar cells 110 are spaced apart from one another at a predetermined distance, for example, a narrow distance equal to or less than about 3 mm.

As shown in FIG. 1, the plurality of solar cells 110 of the solar cell panel 100 are arranged in the string structure (a line structure, or in series). In the string structure, the plurality of solar cells 110 arranged in a row is electrically connected to one another. The solar cell panel 100 shown in FIGS. 1 and 3 has four strings, for example, first to fourth strings S1 to S4.

In the example embodiment of the invention, the first and fourth strings S1 and S4 respectively positioned at edges of the solar cell panel 100 are referred to as outer strings, and the second and third strings S2 and S3 positioned between the outer strings S1 and S4 are referred to as inner strings.

The solar cells 110 arranged in each of the strings S1 to S4 are electrically connected to one another using the interconnectors 120.

Figure 6:
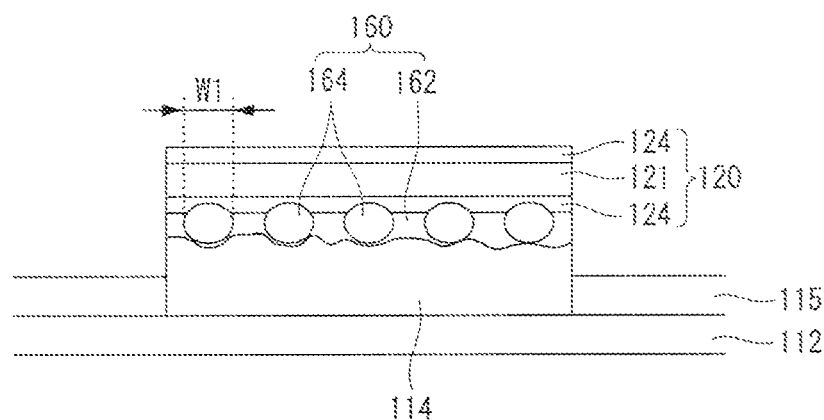
FIGS. 6 to 12 are cross-sectional views illustrating various assembly configurations of solar cells in the solar cell panel shown in FIG. 5.
Figure 7:
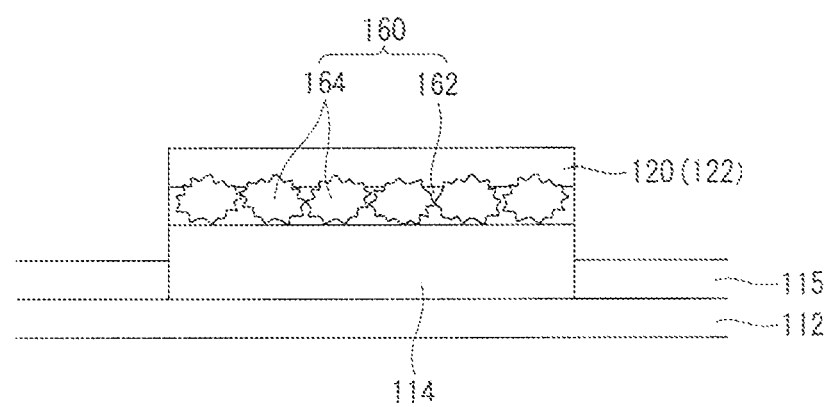

As shown in FIG. 6, the interconnector 120 may include a conductive metal 121, which is formed of a lead-free (or a substantially lead-free) material containing an amount of lead (Pb) equal to or less than about 1,000 ppm, and a solder 124, that is coated on the surface of the conductive metal 121 using a lead material or material containing lead. Alternatively, as shown in FIG. 7, the interconnector 120 may include a conductive metal 121 formed of a lead-free (or a substantially lead-free) material containing lead (Pb) equal to or less than about 1,000 ppm. Thus, in embodiments of the invention, reference to a lead-free material (or a substantially lead-free material) refers to one having an amount of lead that is less than a predetermined amount.

In one string, for example, in the first string S1, a front electrode current collector 114 (shown in FIG. 5) of one of the solar cells 110 positioned adjacently to one another in a longitudinal direction is electrically connected to a back electrode current collector 117 (shown in FIG. 5) of another solar cell 110 adjacent to the one solar cell 110 using the interconnector 120.

As shown in FIG. 3, an interconnector 120a positioned under the first string S1 is connected to an interconnector 120b positioned under the second string S2 using another interconnector 122. An interconnector 120c positioned under the third string S3 is connected to an interconnector 120d positioned under the fourth string S4 using an interconnector 122.

The interconnectors 120a, 120b, 120c, and 120d positioned at the top of each of the strings S1 to S4 are connected to lead wires LW used to transfer the electric power generated in the solar cells 110 to the junction box 300.

In the same manner as the interconnector 120, the lead wire LW may include a conductive metal, that is formed of a lead-free (or a substantially lead-free) material containing an amount of lead (Pb) equal to or less than about 1,000 ppm, and a solder, that is coated on the surface of the conductive metal using a lead material or a material containing lead. Alternatively, the lead wire LW may include a conductive metal formed of a lead-free material containing lead (Pb) equal to or less than about 1,000 ppm.

In the example embodiment of the invention, as shown in FIG. 3, the lead wires connected to the interconnectors 120a and 120d of the outer strings S1 and S4 are referred to as outer lead wires OLW1 and OLW2, and the lead wires connected to the interconnectors 120b and 120c of the inner strings S2 and S3 are referred to as inner lead wires ILW1 and ILW2.

The first outer lead wire OLW1 is connected to the interconnector 120a of the first string S1, and the second outer lead wire OLW2 is connected to the interconnector 120d of the fourth string S4. The first inner lead wire ILW1 is connected to the interconnector 120b of the second string S2, and the second inner lead wire ILW2 is connected to the interconnector 120c of the third string S3. The first and second outer lead wires OLW1 and OLW2 do not overlap the first and second inner lead wires ILW1 and ILW2. Thus, interference is not generated between the first and second outer lead wires OLW1 and OLW2 and the first and second inner lead wires ILW1 and ILW2.

More specifically, as shown in FIG. 4, the first outer lead wire OLW1 includes an interconnector connector OLW1-1 connected to the corresponding interconnector 120a, a connector OLW1-2 whose one end is connected to the interconnector connector OLW1-1, and a junction box connector OLW1-3 connected to the other end of the connector OLW1-2. The second outer lead wire OLW2 includes an interconnector connector OLW2-1 connected to the corresponding interconnector 120d, a connector OLW2-2 whose one end is connected to the interconnector connector OLW2-1, and a junction box connector OLW2-3 connected to the other end of the connector OLW2-2. The first inner lead wire ILW1 includes an interconnector connector ILW1-1 connected to the corresponding interconnector 120b and a junction box connector ILW1-2 connected to one end of the interconnector connector ILW1-1. The second inner lead wire ILW2 includes an interconnector connector ILW2-1 connected to the corresponding interconnector 120c and a junction box connector ILW2-2 connected to one end of the interconnector connector ILW2-1.

The lead wire connected to the interconnector is referred to as a bus ribbon (or a bus bar ribbon) or a bus interconnector (a bus bar interconnector).

In the first and second outer lead wires OLW1 and OLW2, the interconnector connectors OLW1-1 and OLW2-1 are arranged in a direction crossing the corresponding interconnectors 120a and 120d, respectively, and the junction box connectors OLW1-3 and OLW2-3 are arranged in a direction crossing the interconnector connectors OLW1-1 and OLW2-1, i.e., in a direction parallel to the corresponding interconnectors 120a and 120d, respectively.

In the first and second inner lead wires ILW1 and ILW2, the interconnector connectors ILW1-1 and ILW2-1 are arranged in a direction crossing the corresponding interconnectors 120b and 120c, respectively, and the junction box connectors ILW1-2 and ILW2-2 are arranged in a direction crossing the interconnector connectors ILW1-1 and ILW2-1, respectively.

The interconnector connectors OLW1-1 of the first outer lead wire OLW1 and the interconnector connector ILW1-1 of the first inner lead wire ILW1 are arranged in a straight line. The interconnector connectors OLW2-1 of the second outer lead wire OLW2 and the interconnector connector ILW2-1 of the second inner lead wire ILW2 are arranged in a straight line. Further, the interconnector connectors OLW1-1 of the first outer lead wire OLW1, the interconnector connector ILW1-1 of the first inner lead wire ILW1, the interconnector connectors OLW2-1 of the second outer lead wire OLW2, and the interconnector connector ILW2-1 of the second inner lead wire ILW2 are arranged in a straight line.

In the lead wires having the above-described structure, because the interconnector connectors OLW1-1 of the first outer lead wire OLW1, the interconnector connector ILW1-1 of the first inner lead wire ILW1, the interconnector connectors OLW2-1 of the second outer lead wire OLW2, and the interconnector connector ILW2-1 of the second inner lead wire ILW2 are arranged in a straight line, an unnecessary area for arranging the lead wires in the example embodiment of the invention may decrease compared with a related art in which the interconnector connectors are arranged in parallel.

In the first outer lead wire OLW1, the connector OLW1-2 connecting the interconnector connector OLW1-1 to the junction box connector OLW1-3 includes a first connector OLW1-2-1 connected to an end of the interconnector connector OLW1-1 in a direction crossing the interconnector connector OLW1-1 and a second connector OLW1-2-2 connected to the first connector OLW1-2-1 and the junction box connector OLW1-3 in a direction parallel to the interconnector connector OLW1-1. In other words, the first outer lead wire OLW1 has a step shape. In this instance, the end of the interconnector connector OLW1-1 is positioned under an end of the first connector OLW1-2-1, and an end of the junction box connector OLW1-3 is positioned under an end of the second connector OLW1-2-2.

In the second outer lead wire OLW2, the connector OLW2-2 connecting the interconnector connector OLW2-1 to the junction box connector OLW2-3 includes a first connector OLW2-2-1 connected to an end of the interconnector connector OLW2-1 in a direction crossing the interconnector connector OLW2-1 and a second connector OLW2-2-2 connected to the first connector OLW2-2-1 and the junction box connector OLW2-3 in a direction parallel to the interconnector connector OLW2-1. In other words, the second outer lead wire OLW2 has a step shape. In this instance, the end of the interconnector connector OLW2-1 is positioned under an end of the first connector OLW2-2-1, and an end of the junction box connector OLW2-3 is positioned under an end of the second connector OLW2-2-2.

In the first and second inner lead wires ILW1 and ILW2, ends of the interconnector connectors ILW1-1 and ILW2-1 are positioned under ends of the junction box connectors ILW1-2 and ILW2-2, respectively.

In the lead wires having the above-described structure, even if each lead wire is divided into several parts, a height difference between the lead wires may be reduced.

Further, the first outer lead wire OLW1 does not overlap the first inner lead wire ILW1, and the second outer lead wire OLW2 does not overlap the second inner lead wire ILW2. Thus, the interference is not generated between the first and second outer lead wires OLW1 and OLW2 and the first and second inner lead wires ILW1 and ILW2. As a result, an insulating film does not need to be formed between the first and second outer lead wires OLW1 and OLW2 and the first and second inner lead wires ILW1 and ILW2.

However, when the interconnector connectors OLW1-1 and OLW2-1 of the outer lead wires OLW1 and OLW2 and the interconnector connectors ILW1-1 and ILW2-1 of the inner lead wires ILW1 and ILW2 are arranged in parallel, an insulating film has to be formed between the outer lead wires OLW1 and OLW2 and the inner lead wires ILW1 and ILW2 so that the interconnector connectors OLW1-2 and OLW2-2 of the outer lead wires OLW1 and OLW2 do not overlap the interconnector connectors ILW1-1 and ILW2-1 of the inner lead wires ILW1 and ILW2.

Accordingly, when the interconnector connectors OLW1-1 and OLW2-1 of the outer lead wires OLW1 and OLW2 and the interconnector connectors ILW1-1 and ILW2-1 of the inner lead wires ILW1 and ILW2 are arranged in a straight line and the outer lead wires OLW1 and OLW2 have the step shape, the insulating film for insulation between the outer lead wires OLW1 and OLW2 and the inner lead wires ILW1 and ILW2 does not need to be formed. As a result, the manufacturing cost and the number of manufacturing processes may be reduced.

An insulating film 180 is used to insulate the lead wires OLW1, OLW2, ILW1, and ILW2 from the solar cells 110 and the interconnector. The insulating film 180 has enough size to cover the entire connectors OLW1-2 and OLW2-2 of the outer lead wires OLW1 and OLW2, a portion of each of the junction box connectors OLW1-3 and OLW2-3 of the outer lead wires OLW1 and OLW2, and a portion of each of the junction box connectors ILW1-2 and ILW2-2 of the inner lead wires ILW1 and ILW2, as indicated by the dotted line shown in FIG. 4. The insulating film 180 is positioned in a space between the back surfaces of the solar cells 110 and the lead wires OLW1, OLW2, ILW1, and ILW2.

The insulating film 180 may be formed of an opaque material similar to the back sheet 150 or the same opaque material as the back sheet 150. When the insulating film 180 is formed of the opaque material, only the interconnector connectors OLW1-1, OLW2-1, ILW1-1, and ILW2-1 of the lead wires OLW1, OLW2, ILW1, and ILW2 are observed in the front of the solar cell panel 100. Therefore, an external appearance and insulation characteristic may be improved. In embodiments of the invention, the insulating film 180 may be formed of a transparent material.

Connection structures between electrodes of the solar cells and the interconnectors are described with reference to FIGS. 5 to 12.

Figure 5:
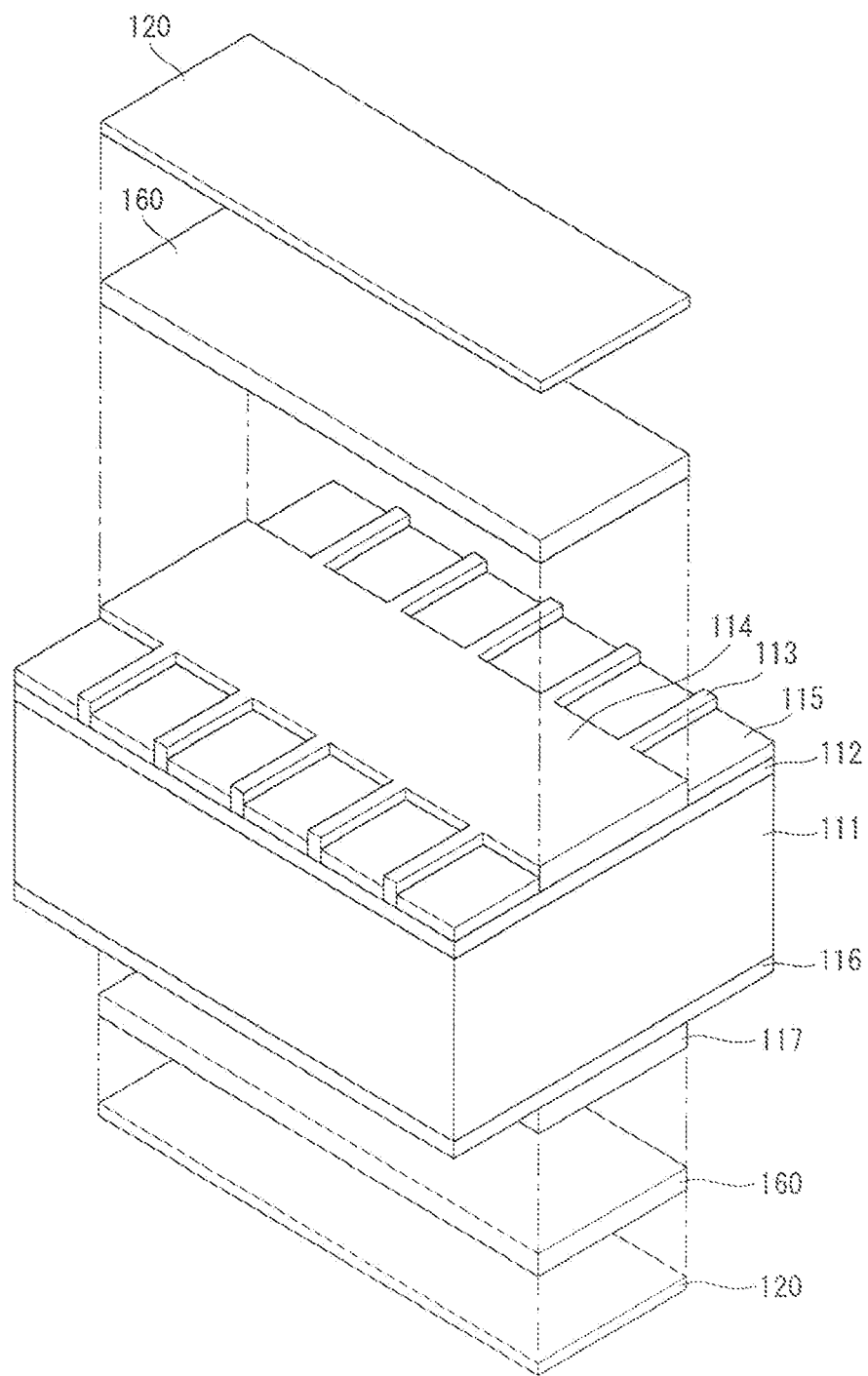
FIG. 5 is an exploded perspective view illustrating a first example configuration of a solar cell in the solar cell panel shown in FIG. 3.

FIG. 5 is an exploded perspective view illustrating a first example configuration of a solar cell in the solar cell panel shown in FIG. 3. FIGS. 6 to 12 are cross-sectional views illustrating various assembly configurations of solar cells in the solar cell panel shown in FIG. 5.

As shown in FIG. 5, the solar cell 110 according to the example embodiment of the invention includes a substrate 111, an emitter layer 112 positioned at a front surface (i.e., a light receiving surface) of the substrate 111 on which light is incident, a plurality of front electrodes 113 positioned on the emitter layer 112, a front electrode current collector 114 positioned on the emitter layer 112, an anti-reflection layer 115 positioned on the emitter layer 112 on which the plurality of front electrodes 113 and the front electrode current collector 114 are not positioned, and a back electrode 116 and a back electrode current collector 117 positioned on a back surface opposite the light receiving surface of the substrate 111.

The solar cell 110 may further include a back surface field (BSF) layer between the back electrode 116 and the substrate 111. The back surface field layer is a region (e.g., a $p^+$-type region) that is more heavily doped than the substrate 111 with impurities of the same conductive type as the substrate 111. The back surface field layer may serve as a potential barrier at the back surface of the substrate 111. Thus, because the back surface field layer may prevent or reduce a recombination and/or a disappearance of electrons and holes around the back surface of the substrate 111, the efficiency of the solar cell 110 may be improved.

The substrate 111 is a semiconductor substrate, which may be formed of first conductive type silicon, for example, p-type silicon, though not required. Silicon used in the substrate 111 may be single crystal silicon, polycrystalline silicon, or amorphous silicon. When the substrate 111 is of a p-type, the substrate 111 contains impurities of a group III element such as boron (B), gallium (Ga), and indium (In).

The surface of the substrate 111 may be textured to form a textured surface corresponding to an uneven surface or having uneven characteristics. When the surface of the substrate 111 is the textured surface, a light reflectance at the light receiving surface of the substrate 111 is reduced. Further, because both a light incident operation and a light reflection operation are performed on the textured surface of the substrate 111, light is confined in the solar cell 110. Hence, a light absorption increases, and the efficiency of the solar cell 110 is improved. In addition, because a reflection loss of light incident on the substrate 111 decreases, an amount of light incident on the substrate 111 further increases.

The emitter layer 112 is a region doped with impurities of a second conductive type (for example, an n-type) opposite the first conductive type (for example, p-type) of the substrate 111. The emitter layer 112 forms a p-n junction along with the substrate 111. When the emitter layer 112 is to be of the n-type, the emitter layer 112 may be formed by doping the substrate 111 with impurities of a group V element such as phosphor (P), arsenic (As), and antimony (Sb).

When energy of light incident on the substrate 111 is applied to the semiconductors of the substrate 111, carriers (e.g., electron-hole pairs, for example) are produced inside the semiconductors, and electrons move to the n-type semiconductor and holes move to the p-type semiconductor. Thus, when the substrate 111 is of the p-type and the emitter layer 112 is of the n-type, the holes move to the p-type substrate 111 and the electrons move to the n-type emitter layer 112.

Alternatively, the substrate 111 may be of an n-type and/or may be formed of semiconductor materials other than silicon. When the substrate 111 is of the n-type, the substrate 111 may contain impurities of a group V element such as phosphorus (P), arsenic (As), and antimony (Sb).

Because the emitter layer 112 forms the p-n junction along with the substrate 111, the emitter layer 112 is of the p-type when the substrate 111 is of the n-type. In this instance, electrons move to the n-type substrate 111 and holes move to the p-type emitter layer 112. When the emitter layer 112 is of the p-type, the emitter layer 112 may be formed by doping a portion of the substrate 111 with impurities of a group III element such as boron (B), gallium (Ga), and indium (In).

The anti-reflection layer 115 on the emitter layer 112 may be formed of silicon nitride ($SiN_x$), silicon dioxide ($SiO_2$), or titanium dioxide ($TiO_2$). The anti-reflection layer 115 reduces a reflectance of light incident on the solar cell 110 and increases selectivity of a predetermined wavelength band of the incident light, thereby increasing the efficiency of the solar cell 110. The anti-reflection layer 115 may have a thickness of about 70 nm to 80 nm. The anti-reflection layer 115 may be omitted, if desired.

The plurality of front electrodes 113 on the emitter layer 112 are electrically and physically connected to the emitter layer 112 and are formed in one direction in a state where the front electrodes 113 are spaced apart from one another. Each of the front electrodes 113 collects carriers (e.g., electrons) moving to the emitter layer 112. Each of the front electrodes 113 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 113.

For example, the front electrodes 113 may be formed of an Ag paste containing lead (Pb). In this instance, the front electrodes 113 may be electrically connected to the emitter layer 112 by way of a process in which the Ag paste is coated on the anti-reflection layer 115 using a screen printing method and the substrate 111 is fired at a temperature of about 750° C. to 800° C. The electrical connection between the front electrodes 113 and the emitter layer 112 is performed by etching the anti-reflection layer 115 using the lead (Pb) contained in the Ag paste during the firing process and which then brings Ag particles of the Ag paste into contact with the emitter layer 112.

At least two front electrode current collectors 114 may be formed on the emitter layer 112 in the direction crossing the front electrodes 113. The front electrode current collectors 114 are electrically and physically connected to the emitter layer 112 and the front electrodes 113. Thus, the front electrode current collectors 114 output carriers (e.g., electrons) transferred from the front electrodes 113 to an external device. The front electrode current collectors 114 are formed of at least one conductive material. The conductive material used for the front electrode current collectors 114 may be at least one selected from the group consisting of Ni, Cu, Ag, Al, Sn, Zn, In, Ti, Au, and a combination thereof. Other conductive materials may be used.

The front electrodes 113 and the front electrode current collectors 114 may be electrically connected to the emitter layer 112 through a punch through operation by way of a process in which the conductive material is applied to the anti-reflection layer 115, patterned, and fired.

As shown in FIG. 6, the surface of the front electrode current collector 114 may be an uneven surface having a plurality of uneven portions. Alternatively, as shown in FIG. 7, the surface of the front electrode current collector 114 may be a flat surface. The surface of the front electrode 113 may be an uneven surface or a flat surface in the same manner as the front electrode current collector 114.

The back electrode 116 is formed on the surface (i.e., the back surface of the substrate 111) opposite the light receiving surface of the substrate 111. The back electrode 116 collects carriers (e.g., holes) moving to the substrate 111. The back electrode 116 is formed of at least one conductive material. The conductive material may be at least one selected from the group consisting of Ni, Cu, Ag, Al, Sn, Zn, In, Ti, Au, and a combination thereof. Other conductive materials may be used for the back electrode 116.

The back electrode current collector 117 is positioned under the back electrode 116 or on the same surface as the back electrode 116 in a direction crossing the front electrodes 113, for example. The back electrode current collector 117 is electrically connected to the back electrode 116. Thus, the back electrode current collector 117 outputs the carriers (e.g., holes) transferred from the back electrode 116 to the external device. The back electrode current collector 117 is formed of at least one conductive material. The conductive material may be at least one selected from the group consisting of Ni, Cu, Ag, Al, Sn, Zn, In, Ti, Au, and a combination thereof. Other conductive materials may be used.

A first conductive adhesive film 160 is positioned on the front electrode current collectors 114 in a direction parallel to the front electrode current collectors 114. Further, the first conductive adhesive film 160 is positioned on the back electrode current collector 117.

FIG. 5 shows that one first conductive adhesive film 160 is positioned on each of the front surface and the back surface of the substrate 111. However, the first conductive adhesive films 160 having the same number as the interconnectors 120 are positioned on each of the front surface and the back surface of the substrate 111.

As shown in FIGS. 6 and 7, the first conductive adhesive film 160 includes a first resin 162 and first conductive particles 164 dispersed in the first resin 162. A material of the first resin 162 is not particularly limited as long as it has the adhesive property. It is preferable, but not required, that a thermosetting resin is used for the first resin 162 so as to increase the adhesive reliability. The thermosetting resin may use at least one selected among epoxy resin, phenoxy resin, acryl resin, polyimide resin, and polycarbonate resin.

The first resin 162 may further contain a predetermined material, for example, a known curing agent and a known curing accelerator other than the thermosetting resin. For example, the first resin 162 may contain a reforming material such as a silane-based coupling agent, a titanate-based coupling agent, and an aluminate-based coupling agent, so as to improve an adhesive strength between the front electrode current collector 114 and the interconnector 120 and an adhesive strength between the back electrode current collector 117 and the interconnector 120. The first resin 162 may contain a dispersing agent such as calcium phosphate and calcium carbonate, so as to improve the dispersibility of the first conductive particles 164. The first resin 162 may contain a rubber component such as acrylic rubber, silicon rubber, and urethane rubber, so as to control the modulus of elasticity of the first resin 162.

A material of the first conductive particles 164 is not particularly limited as long as it has conductivity. As shown in FIG. 6, the first conductive particles 164 may be formed of metal-coated resin particles containing at least one metal selected among copper (Cu), silver (Ag), gold (Au), iron (Fe), nickel (Ni), lead (Pb), zinc (Zn), cobalt (Co), titanium (Ti), and magnesium (Mg) as the main component. Alternatively, as shown in FIG. 7, the first conductive particles 164 may be formed of only metal particles or metal particles containing at least one metal selected among Cu, Ag, Au, Fe, Ni, Pb, Zn, Co, and Mg as the main component As shown in FIG. 6, when the first conductive particles 164 may be formed of the metal-coated resin particles, each first conductive particle 164 may have a circle or a spherical shape.

As shown in FIG. 7, when the first conductive particles 164 may be formed of the metal particles, each first conductive particle 164 may have an uneven or an irregular shape. Since the metal-coated resin particles or the metal particles are well known to those skilled in the art, the detailed structure thereof is not shown in the drawings in detail.

The first conductive adhesive film 160 having the above-described configuration may include a peeling film.

It is preferable, but not required, that the first conductive particles 164 use the metal-coated resin particles, so as to mitigate a compressive stress on the first conductive particles 164 and improve the connection reliability of the first conductive particles 164. It is preferable, but not required, that the first conductive particles 164 have a diameter of about 2 µm to 30 pint, so as to improve the dispersibility of the first conductive particles 164.

It is preferable, but not required, that a composition amount of the first conductive particles 164 dispersed in the first resin 162 is about 0.5% to 20% based on the total volume of the first conductive adhesive film 160 in consideration of the connection reliability after the first resin 162 is cured.

When the composition amount of the first conductive particles 164 is less than about 0.5%, a current may not smoothly flow because a physical contact area between the front electrode current collectors 114 and the first conductive adhesive film 160, and a physical contact area between the back electrode current collectors 117 and the first conductive adhesive film 160 decrease. When the composition amount of the first conductive particles 164 is greater than about 20%, the adhesive strength may be reduced because a composition amount of the first resin 162 relatively decreases.

The first conductive adhesive film 160 is attached to the front electrode current collectors 114 in a direction parallel to the front electrode current collectors 114 and is attached to the back electrode current collectors 117 in a direction parallel to the back electrode current collectors 117.

When a tabbing process is performed using the first conductive adhesive film 160, a heating temperature and a pressure are not particularly limited as long as they are within a range capable of securing an electrical connection and maintaining the adhesive strength.

For example, the heating temperature may be set to a temperature capable of curing the first resin 162, for example, about 140° C. to 180° C. The pressure may be set to a range capable of sufficiently attaching the front electrode current collector 114, the back electrode current collector 117, and the interconnector 120 to the first conductive adhesive film 160. Further, a heating and pressure time may be set to the extent that the front electrode current collector 114, the back electrode current collector 117, and the interconnector 120, etc., are not damaged or deteriorated because of heat.

In the embodiment, a contact surface between the first conductive particles 164 and the interconnector 120 is an uneven surface in a state where the front electrode current collector 114 is attached to the interconnector 120 using the first conductive adhesive film 160.

In other words, as shown in FIGS. 6 and 7, a portion of each first conductive particle 164 may be embedded in the interconnector 120. The contact surface between the first conductive particles 164 and the interconnector 120 may have the same shape as the portion of each first conductive particle 164 embedded in the interconnector 120. A width W1 of the portion of each first conductive particle 164 embedded in the interconnector 120 may be equal to or less than about 2 µm. In embodiments of the invention, at least one of a surface of the interconnector 120 that contacts the first conductive adhesive film 160, a surface of the first conductive adhesive film 160 that contacts the interconnector 120, a surface of the first conductive adhesive film 160 that contacts the front electrode current collector 114, and a surface of the front electrode current collector 114 that contact first conductive adhesive film 160, may be uneven. The various uneven surfaces may be preformed, predetermined, regularly formed, randomly formed, or a combination thereof. In embodiments of the invention, reference to a contact surface between the first conductive particles 164 and the interconnector 120 includes an area of contact between the first conductive particles 164 and the interconnector 120.

When the interconnector 120 includes the conductive metal 121 and the solder 124, a portion of each first conductive particle 164 may be embedded in the solder 124 or may be embedded in the conductive metal 121 and the solder 124. Also, the contact surface may have the same surface shape as the portion of the first conductive particle 164 embedded in the interconnector 120.

As shown in FIG. 6, the first conductive particles 164 may be modified into an oval shape because of the pressure applied during the tabbing process and may be embedded in the interconnector 120. Alternatively, the first conductive particles 164 may remain in a circle shape and may be embedded in the interconnector 120. The shape of the first conductive particles 164 may vary depending on whether a hardness and/or a strength of the first conductive particles 164 are greater or less than a hardness and/or a strength of the interconnector 120.

As shown in FIG. 6, the surface of the front electrode current collector 114 may be the uneven surface having the plurality of uneven portions. Alternatively, as shown in FIG. 7, the surface of the front electrode current collector 114 may be the flat surface. In these instances, because a hardness and/or a strength of the front electrode current collector 114 is greater than the hardness and/or the strength of the first conductive particles 164, the first conductive particles 164 are not embedded in the front electrode current collector 114.

When the hardness and/or the strength of the front electrode current collector 114 is equal to or less than the hardness and/or the strength of the first conductive particles 164, a portion of each first conductive particle 164 may be embedded in the front electrode current collector 114.

In the above-described connection structure, carriers moving to the front electrode current collector 114 move to the interconnector 120 through the first conductive particles 164.

When the first conductive particles 164 do not physically contact one another as shown in FIG. 6, a distance between the first conductive particles 164 may be properly set so that carriers can jump between the adjacent first conductive particles 164. The distance between the first conductive particles 164 may be set by properly adjusting the number or the size of the first conductive particles 164 dispersed in the first resin 162. Additionally, in embodiments of the invention, the first conductive particles 164 may be fitted into spacing formed by the uneven portions of the surface of the front electrode current collector 114.

Alternatively, as shown in FIG. 7, the first conductive particles 164 may physically contact one another. In this instance, carriers moving to the front electrode current collector 114 may be directly transferred to the interconnector 120 through the first conductive particles 164. Further, current may smoothly flow in the solar cell because of an increase in a contact area between the first conductive particles 164 and the interconnector 120.

As above, when the first conductive particles 164 physically contact one another as shown in FIG. 7, carriers moving to the front electrode current collector 114 may be sufficiently transferred to the interconnector 120. Further, at least two first conductive particles 164 may be positioned on the front electrode current collector 114.

The description of FIGS. 6 and 7 illustrating the connection structure between the front electrode current collector 114, the first conductive adhesive film 160, and the interconnector 120 may be equally applied to the connection structure between the back electrode current collector 117, the first conductive adhesive film 160, and the interconnector 120.

A width of each of the front electrode current collector 114, the first conductive adhesive film 160, and the interconnector 120 may vary. This is described in detail with reference to FIGS. 8 to 12.

In the example embodiment of the invention, a width of the first conductive adhesive film 160 is referred to as a first width W2, a width of the interconnector 120 is referred to as a second width W3, and a width of the front electrode current collector 114 is referred to as a third width W4.

Figure 8:
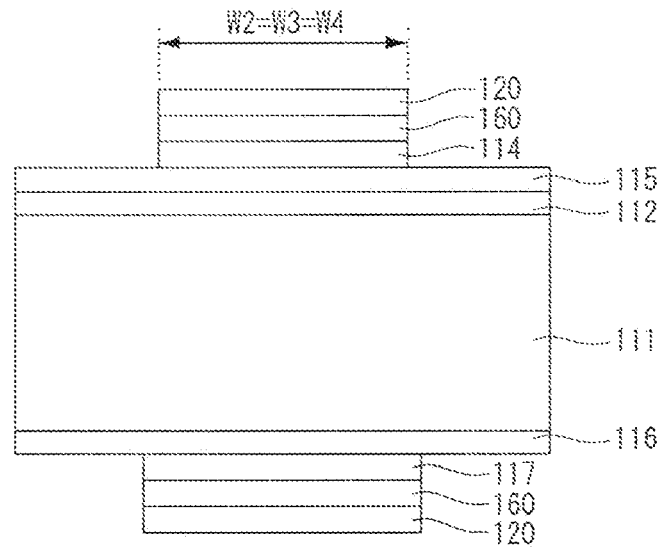

As shown in FIGS. 5 and 8, the first width W2 of the first conductive adhesive film 160, the second width W3 of the interconnector 120, and the third width W4 of the front electrode current collector 114 may be substantially equal to one another (i.e., W2=W3=W4).

When the tabbing process is performed using the first conductive adhesive film 160, an alignment process may be performed very accurately. Thus, the third width W4 of the front electrode current collector 114 may be equal to or less than about 2.0 mm.

Figure 9:
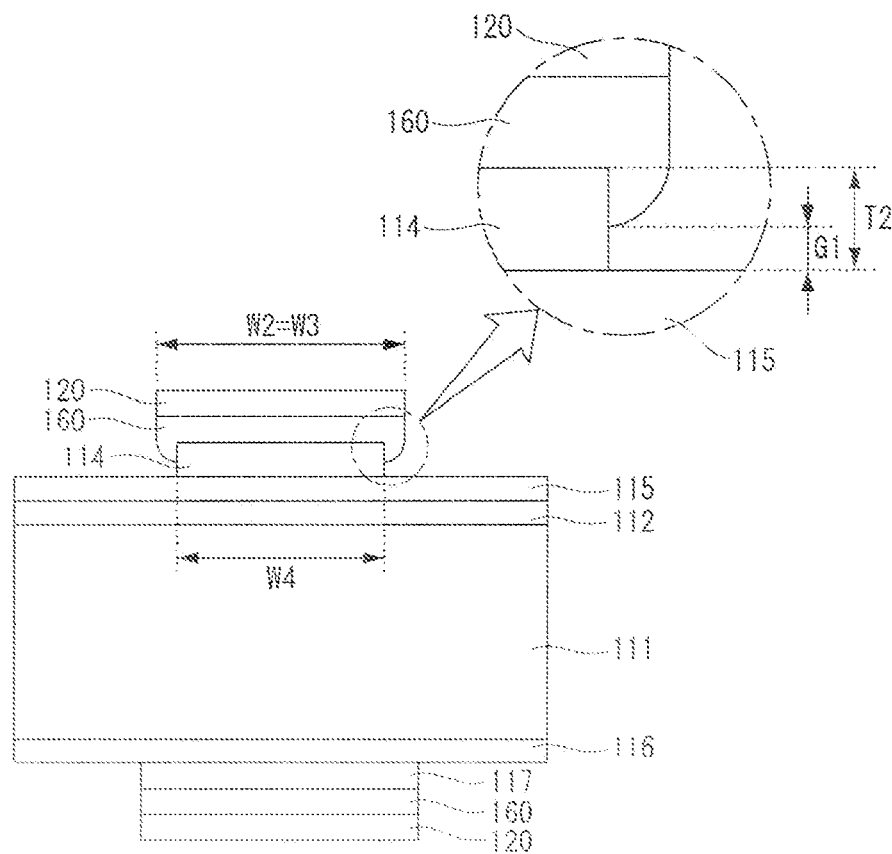

Alternatively, as shown in FIG. 9, the first width W2 and the second width W3 may be substantially equal to each other, and the first width W2 and the second width W3 may be greater than the third width W4. In this instance, the first width W2 and the second width W3 may be equal to or less than about 1.5 times the third width W4.

When the first width W2 is greater than the third width W4, a portion of the first conductive adhesive film 160 may be attached to a portion of a side surface of the front electrode current collector 114 at a distance G1, which may be predetermined, from the surface of the substrate 111, i.e., the surface of the anti-reflection layer 115. The distance G1 may be equal to or greater than about 0.1 times a thickness T2 of the front electrode current collector 114.

Figure 10:
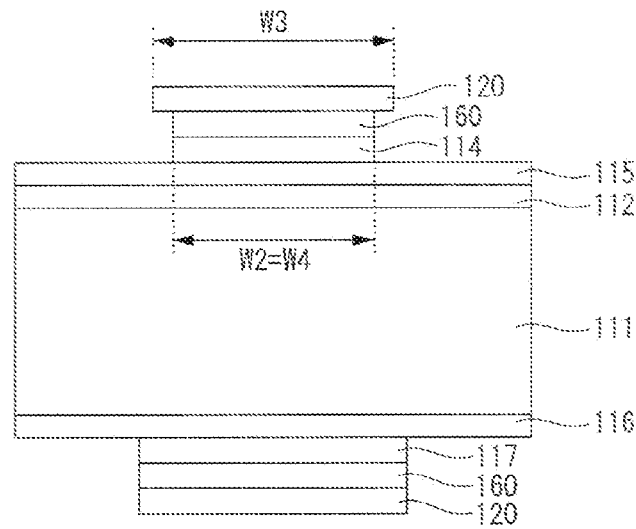

Alternatively, as shown in FIG. 10, the first width W2 may be less than the second width W3 and may be substantially equal to the third width W4. In this instance, the second width W3 may be equal to or less than about 1.5 times the first width W2 and the third width W4.

Figure 11:
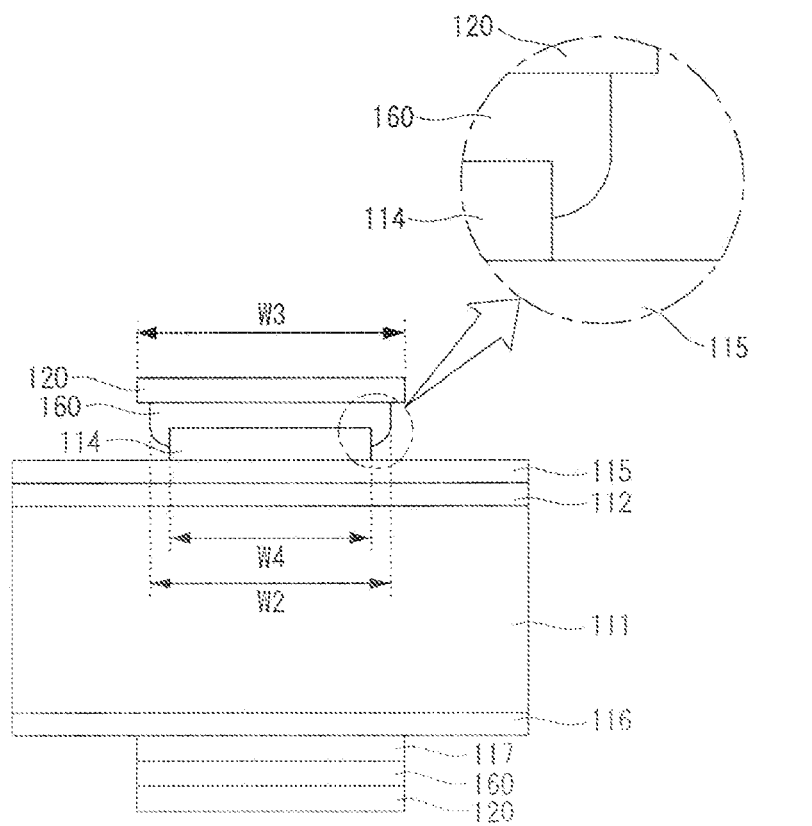

Alternatively, as shown in FIG. 11, the first width W2 may be less than the second width W3 and may be greater than the third width W4. In this instance, the second width W3 may be equal to or less than about 1.5 times the first width W2 and the third width W4. Further, a portion of the first conductive adhesive film 160 is attached to a portion of the side surface of the front electrode current collector 114 at the distance G1 from the surface of the substrate 111, i.e., the surface of the anti-reflection layer 115. The distance G1 is equal to or greater than about 0.1 times the thickness T2 of the front electrode current collector 114.

Figure 12:
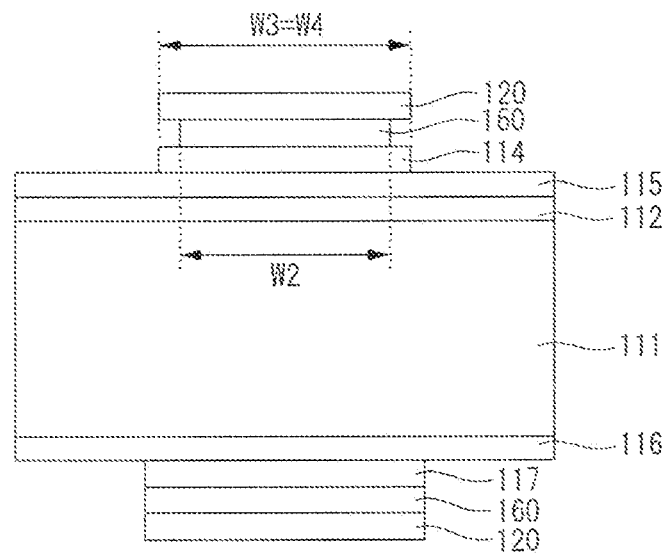

Alternatively, as shown in FIG. 12, the second width W3 may be substantially equal to the third width W4, and the second width W3 and the third width W4 may be greater than the first width W2. In this instance, the second width W3 and the third width W4 may be equal to or less than about 1.5 times the first width W2.

Although FIGS. 8 to 12 illustrate the relationship between the first width W2 of the first conductive adhesive film 160, the second width W3 of the interconnector 120, and the third width W4 of the front electrode current collector 114, the technical configuration illustrated in FIGS. 8 to 12 may be equally applied to the back electrode current collector 117.

When the first conductive adhesive film 160 having the above-described structure is used, an attaching operation between the interconnector 120 and the front electrode current collector 114 and an attaching operation between the interconnector 120 and the back electrode current collector 117 are well performed even if the interconnector 120 is formed of lead-free material.

Figure 13:
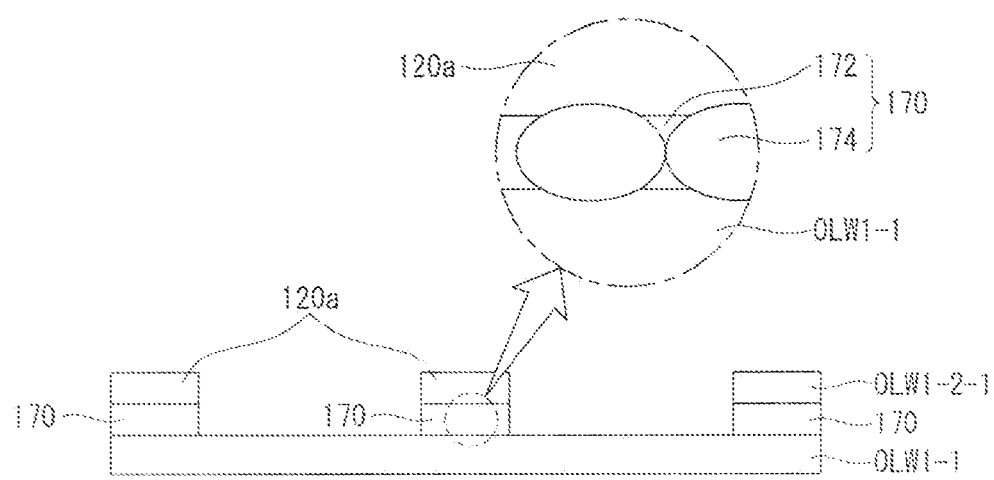
FIG. 13 is a cross-sectional view taken along line XIII-XIII of FIG. 3.

Shown in FIG. 13 is a cross-sectional view taken along line XIII-XIII of FIG. 3, whereby a second conductive adhesive film 170 is positioned between the interconnector connector OLW1-1 of the lead wire OLW1 and the interconnector 120a. Further, the second conductive adhesive film 170 is positioned between the interconnector connector OLW1-1 and the connector OLW1-2-1 of the lead wire OLW1.

The second conductive adhesive film 170 includes a second resin 172 and second conductive particles 174 dispersed in the second resin 172. The second resin 172 may be formed of the same material as the first resin 162 of the first conductive adhesive film 160, and the second conductive particles 174 may be formed of the same material as the first conductive particles 164 of the first conductive adhesive film 160. Alternatively, the second resin 172 may be formed of a material different from the first resin 162, and the second conductive particles 174 may be formed a material different from the first conductive particles 164.

A portion of each second conductive particle 174 may be embedded in the interconnector 120a or the interconnector connector OLW1-1 of the lead wire OLW1.

The above-described example embodiment of the invention described that the outer lead wires OLW1 and OLW2 are divided into the interconnector connectors OLW1-1 and OLW2-1, the first connectors OLW1-2-1 and OLW2-2-1, the second connectors OLW1-2-2 and OLW2-2-2, and the junction box connectors OLW1-3 and OLW2-3, respectively, and the inner lead wires ILW1 and ILW2 are divided into the interconnector connectors ILW1-1 and ILW2-1 and the junction box connectors ILW1-2 and ILW2-2, respectively. However, each of the lead wires OLW1, OLW2, ILW1, and ILW2 used in the solar cell module need not be divided and may be used as an integral body.

A second example configuration of the solar cell in the solar cell panel shown in FIG. 3 is described below with reference to FIGS. 14 to 22.

Figure 14:
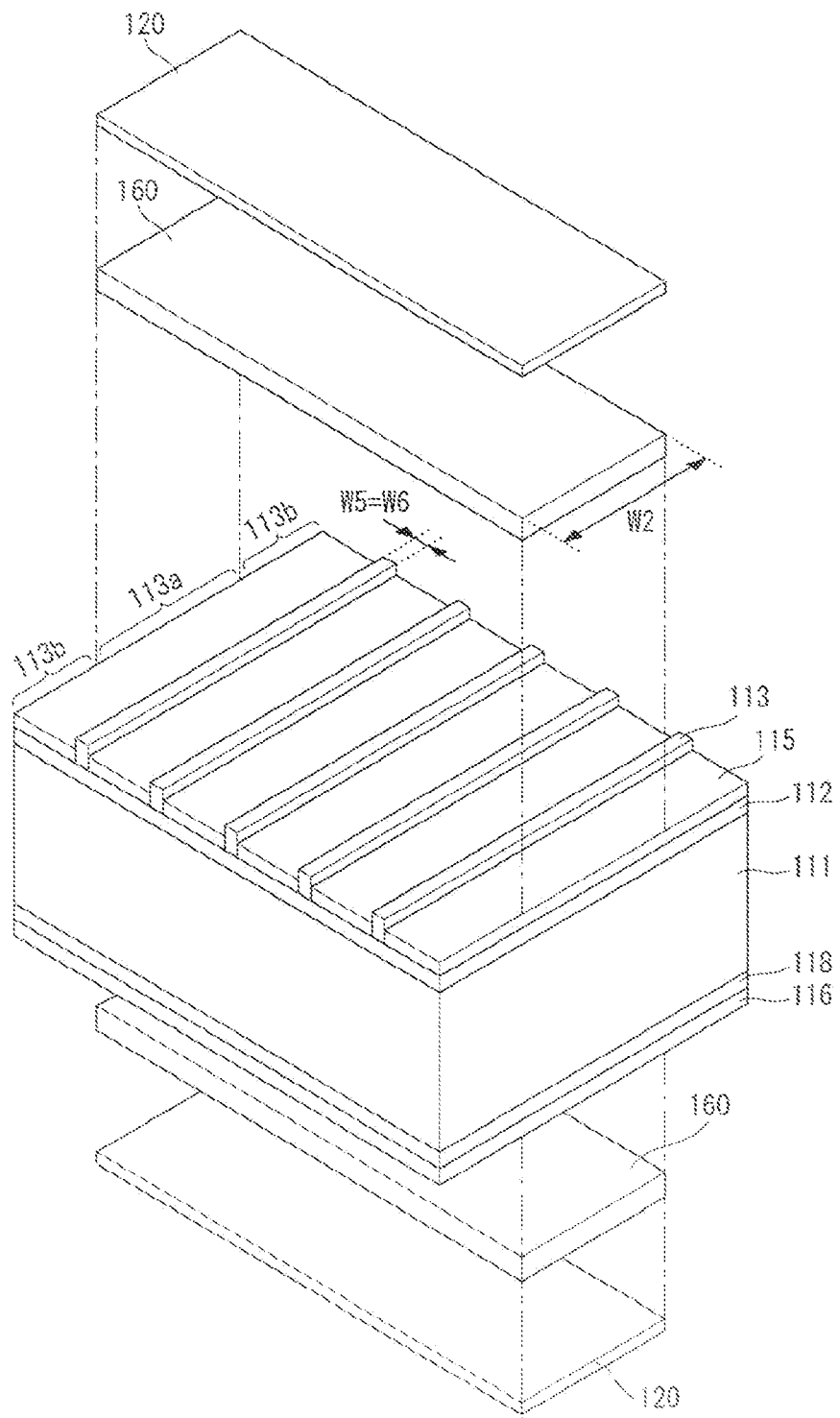
FIG. 14 is an exploded perspective view illustrating a second example configuration of a solar cell in the solar cell panel shown in FIG. 3.
Figure 15:
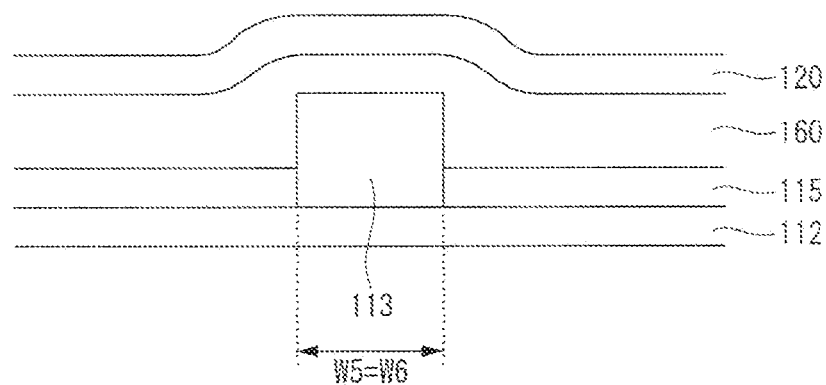
FIG. 15 is a cross-sectional view illustrating an assembly configuration of a solar cell in the solar cell panel shown in FIG. 14.
Figure 16:
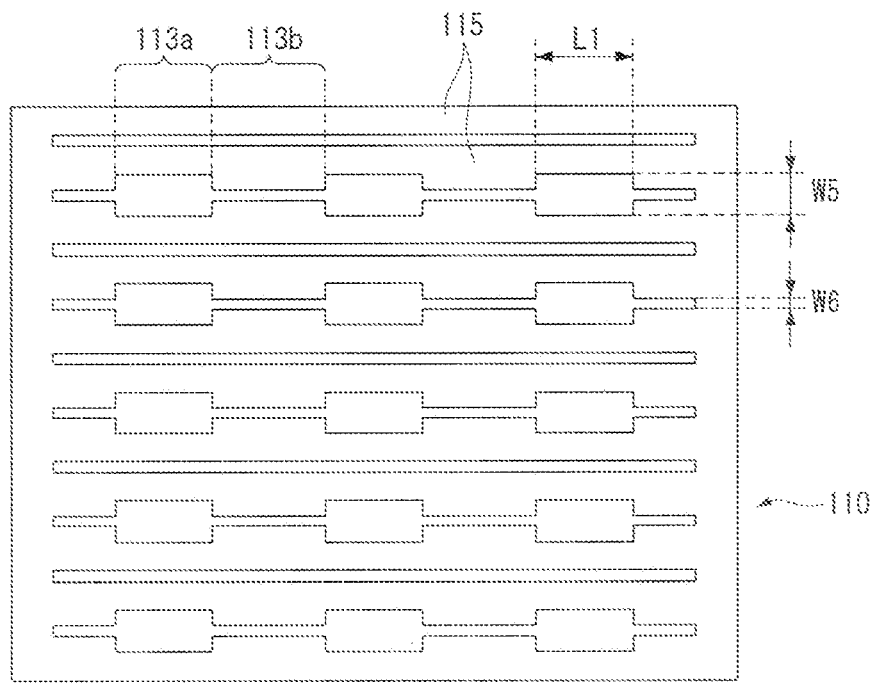
FIGS. 16 and 17 are plane views of a front surface of a substrate of a solar cell illustrating various configurations of a front electrode.
Figure 17:
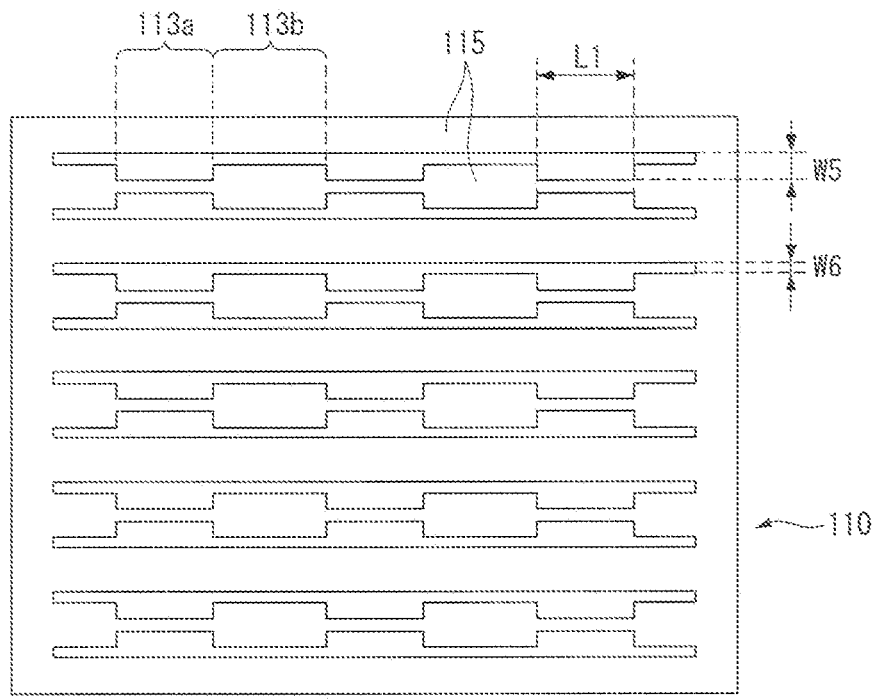
Figure 18:
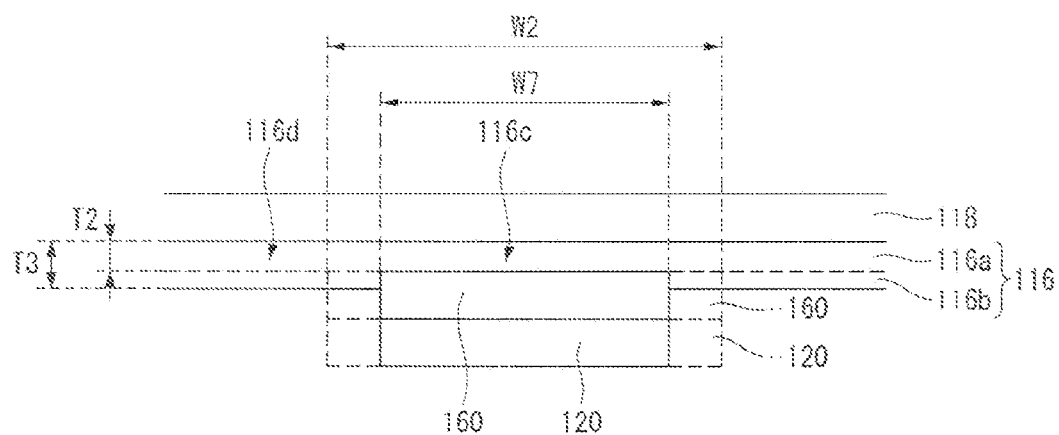
FIGS. 18 and 19 are cross-sectional views illustrating various assembly configurations of a back surface of a substrate of a solar cell in the solar cell panel shown in FIG. 14.
Figure 19:
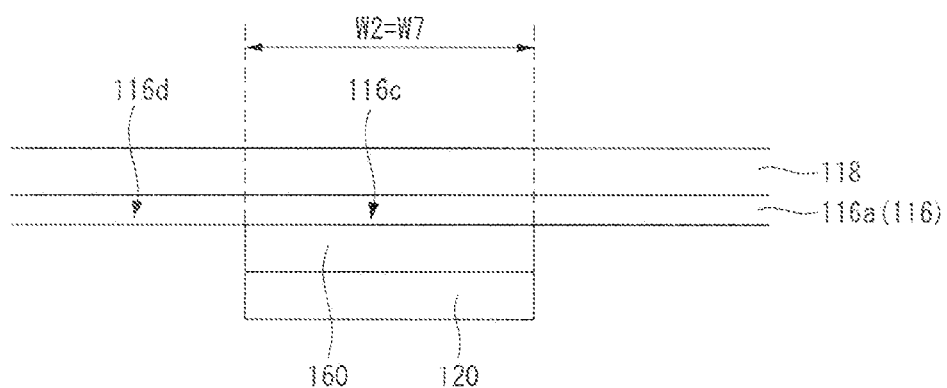
Figure 20:
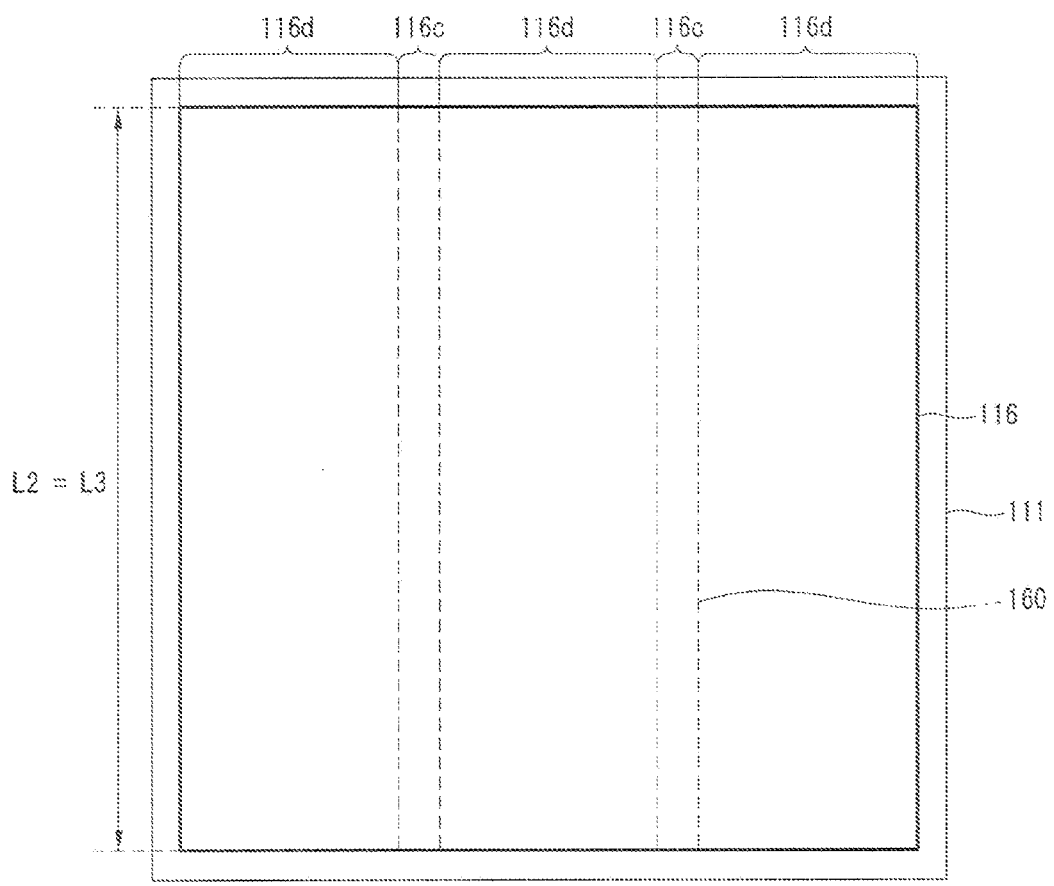
FIGS. 20 to 22 are plane views of a back surface of a substrate of a solar cell illustrating various configurations of a back electrode.
Figure 21:
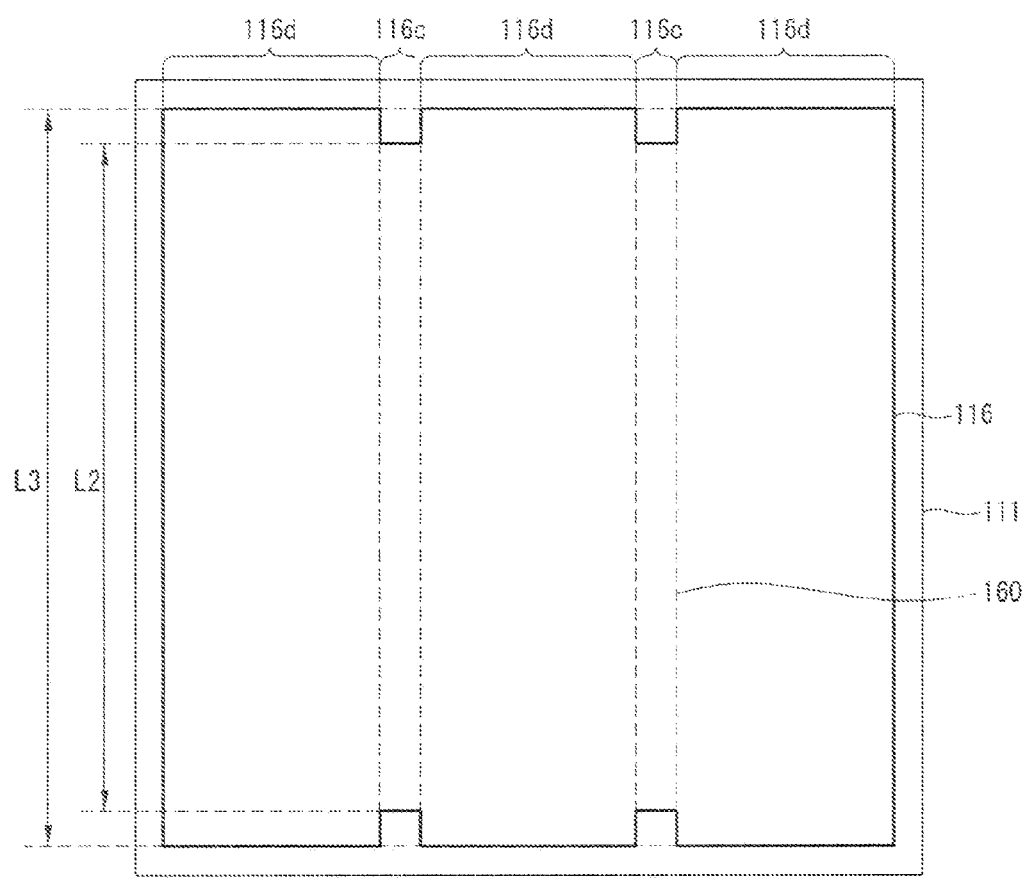
Figure 22:
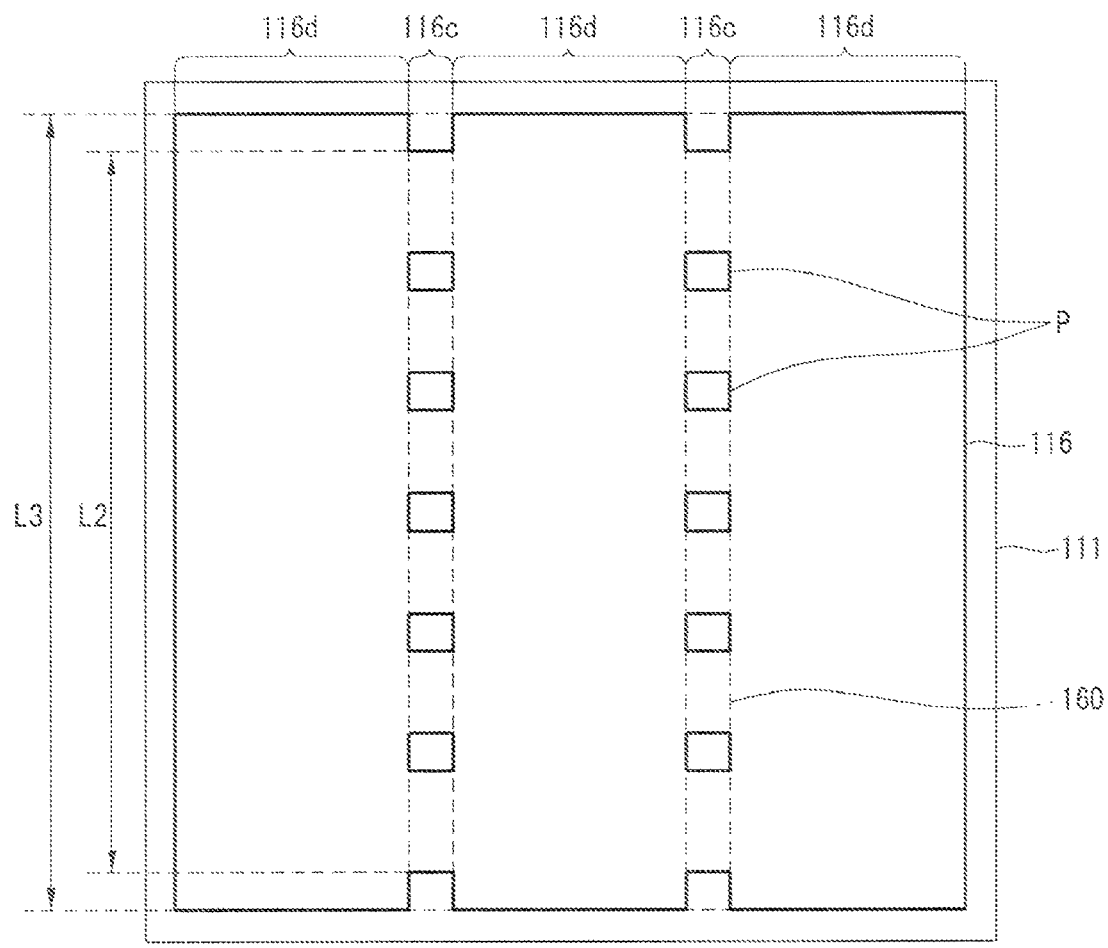

FIG. 14 is an exploded perspective view illustrating a second example configuration of a solar cell in the solar cell panel shown in FIG. 3. FIG. 15 is a cross-sectional view illustrating an assembly configuration of a solar cell in the solar cell panel shown in FIG. 14. FIGS. 16 and 17 are plane views of the front surface of the substrate of a solar cell illustrating various configurations of the front electrode. Further, FIGS. 18 and 19 are cross-sectional views illustrating various assembly configurations of the back surface of the substrate of a solar cell in the solar cell panel shown in FIG. 14. FIGS. 20 to 22 are plane views of the back surface of the substrate of a solar cell illustrating various configurations of the back electrode.

In the first example configuration of the solar cell panel 100, the solar cell 110 includes both the front electrode current collector 114 and the back electrode current collector 117. On the other hand, in the second example configuration of the solar cell panel 100, the solar cell 110 does not include the front electrode current collector and the back electrode current collector.

More specifically, the solar cell 110 according to the second example configuration of the solar cell panel 100 includes the substrate 111, the emitter layer 112 positioned at the front surface of the substrate 111, the plurality of front electrodes 113 positioned on the emitter layer 112, the anti-reflection layer 115 positioned on the emitter layer 112 on which the plurality of front electrodes 113 are not positioned, the back electrode 116 positioned on the back surface of the substrate 111, and a back surface field (BSF) layer 118 positioned between the back electrode 116 and the substrate 111.

A plurality of first conductive adhesive films 160 are positioned on the emitter layer 112 in a direction crossing the front electrodes 113. Further, the plurality of first conductive adhesive films 160 are positioned on the back electrode 116 in the direction crossing the front electrodes 113.

FIG. 14 shows that one first conductive adhesive film 160 is positioned on each of the front surface and the back surface of the substrate 111. Additionally, the same number of first conductive adhesive films 160 as the number of interconnectors 120 is positioned on each of the front surface and the back surface of the substrate 111.

The first conductive adhesive film 160 on the front surface of the substrate 111 is attached to a portion of each front electrode 113 in the direction crossing the front electrodes 113. Thus, a portion of the first conductive adhesive film 160 directly contacts the portion of each front electrode 113, and a remaining portion of the first conductive adhesive film 160 directly contacts the anti-reflection layer 115. Thus, the first conductive adhesive film 160 is positioned between the front electrodes 113 and the interconnector 120 without an intervening layer, and/or the first conductive adhesive film 160 is positioned between the anti-reflection layer 115 and the interconnector 120 without an intervening layer. Accordingly, plurality of front electrodes 113 respectively have areas that overlap with areas of the first conductive adhesive film 160, and the areas of the respective plurality of front electrodes 113 are thereby also in contact with the areas of the first conductive adhesive film 160. Therefore, areas of the plurality of front electrodes 113 and areas of the first conductive adhesive film 160 that overlap are the same areas of the plurality of front electrodes 113 and areas of the first conductive adhesive film 160 that are in contact.

Each front electrode 113 includes a first portion 113a attached to the first conductive adhesive film 160 and a second portion 113b not attached to the first conductive adhesive film 160.

One surface of the interconnector 120 is attached to a front surface of the first conductive adhesive film 160 attached to the first portion 113a of the front electrode 113 in the same direction as a formation direction of the first conductive adhesive film 160. The other surface of the interconnector 120 not attached to the first conductive adhesive film 160 is attached to the back electrode 116 of the adjacent solar cell 110.

In the same manner as the first example configuration, a portion of each first conductive particle of the first conductive adhesive film 160 may be embedded in the interconnector 120 in a state where the front electrodes 113 are attached to the interconnector 120 using the first conductive adhesive film 160.

A remaining portion of the first conductive adhesive film 160 not attached to the first portion 113a of the front electrode 113 directly contacts the anti-reflection layer 115 on the emitter layer 112.

The first conductive adhesive film 160 may have a thickness greater than a protruding thickness of the front electrode 113, so that the first conductive adhesive film 160 and the interconnector 120 are well attached to each other. In this instance, because the front surface of the first conductive adhesive film 160 is a flat surface, the first conductive adhesive film 160 and the interconnector 120 are well attached to each other.

Because a thickness of the front electrode 113 is generally equal to or less than about 15 µm, the protruding thickness of the front electrode 113 is less than about 15 µm. Thus, the thickness of the first conductive adhesive film 160 may be about 15 µm to 60 µm based on specifications of the solar cell to be used in the solar cell panel.

The first conductive adhesive film 160 may have a height difference. The height difference is generated because of the front electrodes 113. When the first conductive adhesive film 160 has the height difference, the interconnector 120 may have the same height difference as the first conductive adhesive film 160.

In the structure shown in FIGS. 14 and 15, a width W5 of the first portion 113a of the front electrode 113 may be substantially equal to a width W6 of the second portion 113b of the front electrode 113. Alternatively, the width W5 of the first portion 113a of the front electrode 113 may be different from the width W5 of the second portion 113b of the front electrode 113.

As shown in FIG. 16, the width W5 of the first portion 113a of the front electrode 113 may be greater than the width W6 of the second portion 113b of the front electrode 113. When the width W5 of the first portion 113a is greater than the width W6 of the second portion 113b, an adhesive strength between the first conductive adhesive film 160 and the front electrode 113 is improved, and a contact resistance between the first conductive adhesive film 160 and the front electrode 113 decreases. Hence, an output reduction thereof may be prevented or reduced.

The first portion 113a having the width W5 greater than the width W6 of the second portion 113b may be formed for only the front electrodes 113 positioned on predetermined rows, and the first portion 113a having the same width as the second portion 113b may be formed in the front electrodes 113 positioned on remaining rows. For example, as shown in FIG. 16, each of the front electrodes 113 positioned on even-numbered rows may include the first portion 113a having the width W5 greater than the width W6 of the second portion 113b, and each of the front electrodes 113 positioned on odd-numbered rows may include the first portion 113a having the same width as the second portion 113b.

The first portion 113a having the width W5 greater than the width W6 of the second portion 113b may be formed only in the front electrodes 113 positioned on the odd-numbered rows and/or may have various shapes other than the shape shown in FIG. 16. For example, the various shapes may include a triangle or a semicircle.

The first portion 113a is formed in an up-down symmetric manner based on the front electrode 113 and has a length L1, which may be predetermined, in a longitudinal direction of the front electrode 113. It is preferable, but not required, that the length L1 of the first portion 113a is equal to or less than the first width W2 of the first conductive adhesive film 160, so as to improve the adhesive strength between the first conductive adhesive film 160 and the front electrodes 113 and reduce the contact resistance between the first conductive adhesive film 160 and the front electrodes 113.

When the first width W2 of the first conductive adhesive film 160 is less than about 1 mm, the contact resistance increases. When the first width W2 of the first conductive adhesive film 160 is greater than about 20 mm, the light receiving area decreases. Thus, the first width W2 of the first conductive adhesive film 160 may be approximately 1 mm to 20 mm.

Thus, the length L1 of the first portion 113a may be properly set within the range of the first width W2 of the first conductive adhesive film 160 based on specifications or dimensions of the solar cell.

Alternatively, as shown in FIG. 17, each of the front electrodes 113 positioned on all of the rows may include the first portion 113a having the width W5 greater than the width W6 of the second portion 113b.

The adjacent first portions 113a may protrude opposite to each other. The adjacent first portions 113a may protrude in the same direction. In this embodiment of the invention, the first portions 131a extend away from the front electrodes 113, or middle portions thereof, at one side. Thus, along a length of the front electrode 113 in one row, the first portions 113a exists on only one side of the front electrode 113. In the embodiment of the invention shown in FIG. 17, the first portions 113a of adjacent front electrodes 113 face each other. But in other embodiments, the first portions 113a of the adjacent front electrodes 113 may be on the same side, respectively, so that the first portions 113a would all face towards the same side, such as downward or upward, for example. In embodiments of the invention, the first portions 113a are flaps that extend from the front electrodes 113 at one or both sides thereof.

In the example embodiment, the back electrode 116 is formed of aluminum (Al). Thus, the back electrode 116 may be formed by coating an Al paste and firing the Al paste.

The aluminum paste used may include an aluminum powder, a bismuth-based glass frit, and an organic vehicle. The aluminum powder has a middle diameter D50 equal to or less than about 10 µm in a particle distribution based on a laser diffraction method. The bismuth-based glass frit contains bismuth oxide as an essential component and has a glass softening temperature equal to or less than about 580° C.

The aluminum powder refers to an aggregate of particles containing aluminum as the main component and may contain a small amount of impurities other than aluminum.

The middle diameter D50 refers to a diameter when a cumulative volume is about 50% in a particle distribution of the corresponding powder. The middle diameter D50 may be easily measured using various particle distribution measuring devices based on the laser diffraction method.

It is preferable, but not required, that particles constituting the aluminum powder have a sphere shape. However, the particles constituting the aluminum powder may have other shapes such as a flake shape and/or a non-uniform shape.

It is preferable, but not required, that an amount of the aluminum powder is about 65% to 85% based on the total amount of the aluminum paste, and an amount of bismuth oxide in the bismuth-based glass frit is equal to or more than about 40% based on the total amount of the bismuth-based glass frit.

Examples of the bismuth-based glass frit include a glass frit containing bismuth oxide, boron oxide ($B_2O_3$), and zinc oxide (ZnO) as the main component, a glass frit containing bismuth oxide, boron oxide ($B_7O_3$), and silicon oxide as the main component, and a glass frit containing bismuth oxide, silicon oxide, and lead oxide as the main component. Further, the bismuth-based glass frit may further contain barium oxide (BaO) and silicon dioxide ($SiO_2$).

An amount of the bismuth-based glass frit may be approximately 1% to 10% based on the total amount of the aluminum paste.

The organic vehicle is not particularly limited as long as it can sufficiently disperse the aluminum powder and the bismuth-based glass frit. The organic vehicle may be at least one of ethylene glycol, diethylene glycol derivative (glycol ether-based derivative), toluene or xylene.

An amount of the organic vehicle may be approximately 10% to 30% based on the total amount of the aluminum paste.

The back electrode 116 may be manufactured or formed by applying the aluminum paste manufactured as discussed above to the back surface of the substrate 111, drying the applied aluminum paste at a proper temperature (for example, a room temperature to about 100° C.), and heating (firing) the dried aluminum paste using a firing furnace under the proper heating conditions (for example, at about 700° C. to 800° C.). The back surface field layer 118 is formed simultaneously with the firing of the aluminum paste.

As shown in FIG. 18, when the back electrode 116 is manufactured or formed using the aluminum paste, a high density aluminum layer 116a is formed on the surface of the substrate 111 and a low density aluminum layer 116b is formed on the surface of the high density aluminum layer 116a. Further, an aluminum oxide layer is formed on the surface of the low density aluminum layer 116b. Alternatively, impurities exist at the surface of the low density aluminum layer 116b.

When the aluminum oxide layer or the impurities exist at the surface of the back electrode 116, an adhesive strength between the first conductive adhesive film 160 and the back electrode 116 may be reduced. Thus, before the first conductive adhesive film 160 is attached to the back electrode 116, the surface processing of the back electrode 116 may be performed.

The surface processing of the back electrode 116 may be performed through a cleansing process using a gas (for example, air or an inert gas such as nitrogen gas), pure water or a grinding process using a roller.

When the surface processing of the back electrode 116 is performed, the low density aluminum layer 116b may be removed along with the aluminum oxide layer or the impurities existing at the surface of the back electrode 116.

The first conductive adhesive film 160 is attached to the back electrode 116 having the above-described configuration. The back electrode 116 includes a first portion 116c attached to the first conductive adhesive film 160 and a second portion 116d adjacent to the first portion 116c. Thus, the first conductive adhesive film 160 directly contacts the first portion 116c of the back electrode 116.

The interconnector 120 is attached to a back surface of the first conductive adhesive film 160 attached to the first portion 116c of the back electrode 116 in the same direction as a formation direction of the first conductive adhesive film 160. A remaining portion (or an opposite end) of the interconnector 120 not attached to the first conductive adhesive film 160 is electrically connected to the front electrodes 113 of the adjacent solar cell 110.

A portion of each first conductive particle of the first conductive adhesive film 160 may be embedded in the interconnector 120 in a state where the back electrodes 116 is attached to the interconnector 120 using the first conductive adhesive film 160.

The surface processing of the back electrode 116 for removing the aluminum oxide layer and/or the impurities existing at the surface of the back electrode 116 may be performed only on the first portion 116c of the back electrode 116 attached to the first conductive adhesive film 160. The low density aluminum layer 116b on the surface of the high density aluminum layer 116a is removed along with the aluminum oxide layer and/or the impurities.

Thus, as shown in FIG. 18, the first portion 116c of the back electrode 116 is formed of only the high density aluminum layer 116a, and the second portion 116d of the back electrode 116 is formed of the high density aluminum layer 116a, the low density aluminum layer 116b, and the aluminum oxide layer. Therefore, a thickness T2 of the first portion 116c is less than a thickness T3 of the second portion 116d. In an embodiment of the invention, the first conductive adhesive film 160 is positioned between the back electrode 116 and the interconnector 120 without an intervening layer. Accordingly, the first conductive adhesive film 160 is directly attached to (or in contact with) the back electrode 116 and the interconnector 120.

When the thickness T2 of the first portion 116c is less than the thickness T3 of the second portion 116d, the width W2 of the first conductive adhesive film 160 may be equal to or less than a width W7 of the first portion 116c as indicated by the solid line shown in FIG. 18 (i.e., W7≥W2). In the structure shown in FIG. 18, the first conductive adhesive film 160 directly contacts the first portion 116c, but does not directly contact the second portion 116d. In this instance, the width W2 of the first conductive adhesive film 160 may be equal to or greater than the width of the interconnector 120. Alternatively, the width W2 of the first conductive adhesive film 160 may be less than the width of the interconnector 120.

Further, the width W2 of the first conductive adhesive film 160 may be greater than the width W7 of the first portion 116c as indicated by the dotted line shown in FIG. 18 (i.e., W2>W7). In this instance, the width W2 of the first conductive adhesive film 160 may be equal to or greater than the width of the interconnector 120. Alternatively, the width W2 of the first conductive adhesive film 160 may be less than the width of the interconnector 120.

Because the aluminum oxide layer existing at the surface of the back electrode 116 is removed even if the back electrode 116 does not include the low density aluminum layer 116b, a slight thickness difference between the first and second portions 116c and 116d may be generated.

As shown in FIG. 19, when the surface processing is performed on the entire surface of the back electrode 116, both the first and second portions 116c and 116d are formed of only the high density aluminum layer 116a. Therefore, the first and second portions 116c and 116d have substantially the same thickness. In this instance, the width W2 of the first conductive adhesive film 160 is substantially equal to the width W7 of the first portion 116c (i.e., W2=W7).

As shown in FIG. 20, the back electrode 116 may be formed on the entire back surface of the substrate 111 except an edge portion (or edge portions) of the substrate 111. In this instance, a length of the first conductive adhesive film 160 may be equal to, slightly shorter than, or slightly longer than a length L2 of the first portion 116c and a length L3 of the second portion 116d.

As shown in FIG. 21, the length L2 of the first portion 116c may be shorter than the length L3 of the second portion 116d. In this instance, because the length of the first conductive adhesive film 160 is longer than the length L2 of the first portion 116c, the adhesive strength may increase by bringing at least one end of the first conductive adhesive film 160 into direct contact with the substrate 111 outside the first portion 116c. Further, the length of the first conductive adhesive film 160 may be substantially equal to the length L3 of the second portion 116d. Alternatively, the length of the first conductive adhesive film 160 may be substantially equal to or shorter than the length L2 of the first portion 116c.

As shown in FIG. 22, hole patterns P exposing the substrate 111 may be formed in a portion of the first portion 116c of the back electrode 116. In the structure shown in FIG. 22, because the first conductive adhesive film 160 directly contacts the substrate 111 in the hole patterns P, the adhesive strength of the first conductive adhesive film 160 increases.

Although FIG. 22 shows the hole patterns P positioned parallel to one another in a row direction (i.e., in a transverse direction in FIG. 22), the hole patterns P need not be positioned parallel to one another in the row direction and may be non-uniformly positioned.

In the structure shown in FIG. 22, carriers moving to the back electrode 116 are transferred to the interconnector 120 through the first conductive particles of the first conductive adhesive film 160. Thus, because the back electrode current collector for transferring the carriers moving to the back electrode 116 to the interconnector may be omitted, the process and the cost required to form the back electrode current collector may be reduced or eliminated.

Figure 23:
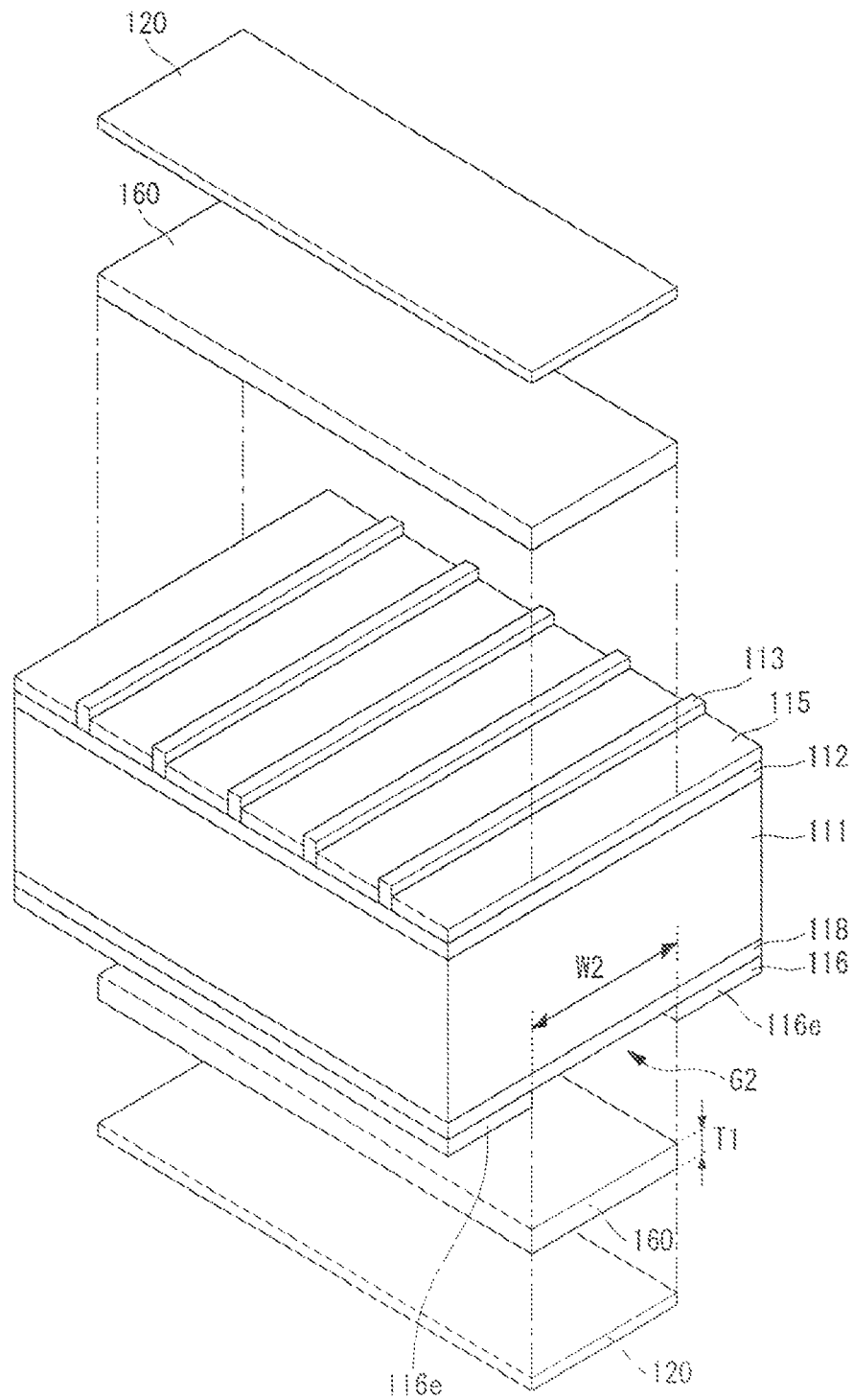
FIG. 23 is an exploded perspective view illustrating a third example configuration of the solar cell panel of a solar cell shown in FIG. 3.
Figure 24:
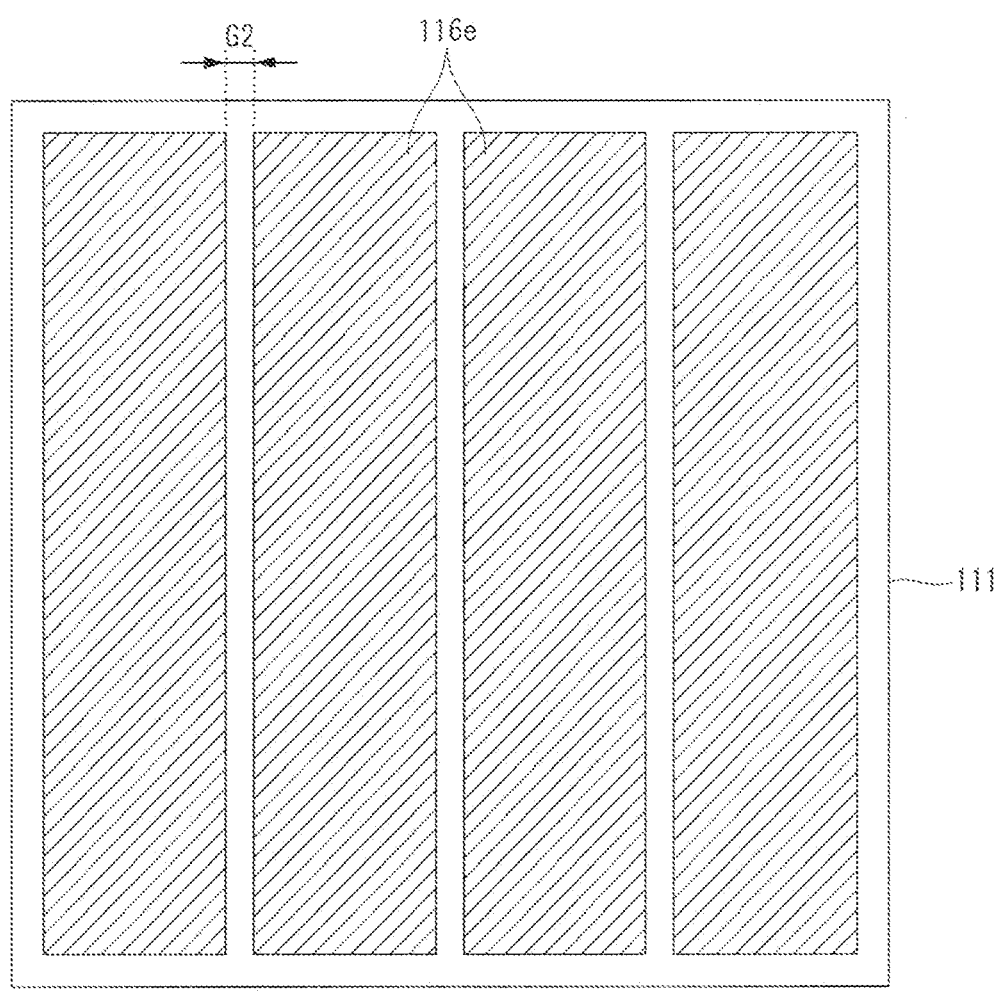
FIG. 24 is a plane view of a back surface of a substrate of a solar cell illustrating a configuration of a back electrode.
Figure 25:
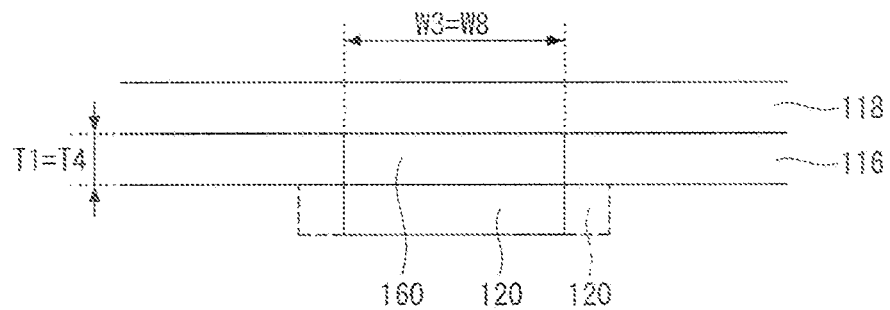
FIGS. 25 to 27 are cross-sectional views illustrating various assembly configurations of solar cells in the solar cell panel shown in FIG. 23.
Figure 26:
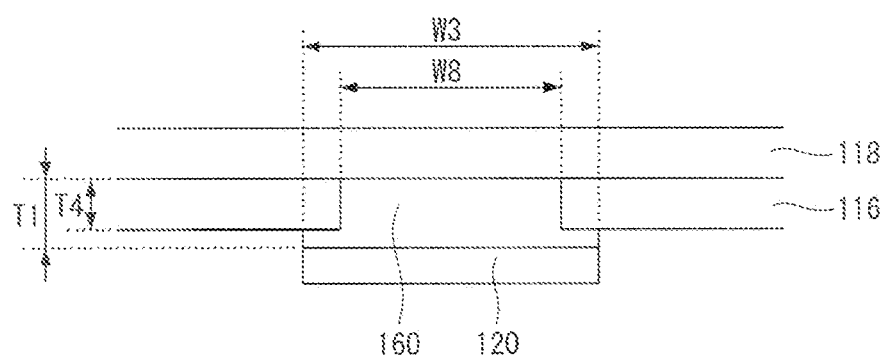
Figure 27:
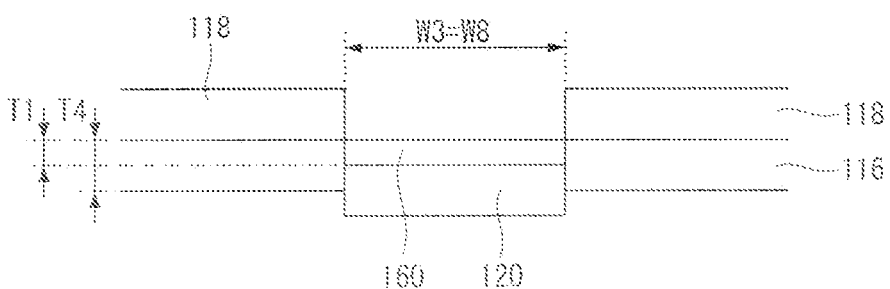

A third example configuration of the solar cell panel is described with reference to FIGS. 23 to 27. FIG. 23 is an exploded perspective view illustrating a third example configuration of a solar cell in the solar cell panel shown in FIG. 3. FIG. 24 is a plane view of the back surface of the substrate of a solar cell illustrating a configuration of the back electrode. FIGS. 25 to 27 are cross-sectional views illustrating various assembly configurations of solar cells in the solar cell panel shown in FIG. 23.

In the third example configuration of the solar cell panel, as shown in FIGS. 23 and 24, the back electrode 116 includes a plurality of electrode parts 116e that are spaced apart from one another at a space G2, which may be may or may not be uniform, and may have a predetermined width. The space G2 exposes the back surface of the substrate 111 so that the first conductive adhesive film 160 directly contacts the back surface of the substrate 111. Because the interconnector 120 is attached to the first conductive adhesive film 160, the number of electrode parts 116e is more than the number of interconnectors 120 by one.

The back electrode 116 including the plurality of electrode parts 116e is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The back electrode 116 having the above-described configuration may be manufactured by applying a conductive paste containing the conductive material to the entire back surface of the substrate 111, drying and firing the conductive paste, removing the conductive paste existing in a location to form the first conductive adhesive film 160, and forming the plurality of electrode parts 116e that are spaced apart from one another at the space G2. The edge portion of the back surface of the substrate 111 is excluded in the entire back surface of the substrate 111.

In a method for manufacturing the back electrode 116, impurities are injected inside the substrate 111 during the firing of the conductive paste. Thus, the back surface field layer 118 is formed during the firing of the conductive paste. Because a process for forming the space G2 is performed after the conductive paste is fired, the back surface field layer 118 may be still formed on the entire back surface of the substrate 111 even in a portion of the back surface of the substrate 111 that is located in the space G2. In an embodiment of the invention, a portion of the back electrode 116 need not be removed, or not formed, for example, so that a single sheet of back electrode 116 exists on the back surface of the substrate 111.

When the back electrode 116 does not include the plurality of electrode parts 116e, it is not easy to attach the first conductive adhesive film 160 to the back surface of the back electrode 116 because of the oxide layer may be formed on the surface of the back electrode 116. Nevertheless, the oxide layer may be removed to enable the first conductive adhesive film 160 to be attached directly to the back surface of the back electrode 116. In such an instance, the first conductive adhesive film 160 is positioned between the back electrode 116 and the interconnector 20 without an intervening layer. Accordingly, the first conductive adhesive film 160 is directly attached to (or in contact with) the back electrode 116 and the interconnector 20.

However, as described above, when the space G2 is formed between the plurality of electrode parts 116e and the first conductive adhesive film 160 is attached to the back surface of the substrate 111 exposed through the space G2, the adhesive strength of the first conductive adhesive film 160 is improved compared with the back electrode 116 not including the electrode parts 116e.

The first conductive adhesive film 160 is attached to the back surface of the substrate 111 exposed through the space G2 formed between the plurality of electrode parts 116e.

The interconnector 120 is attached to the back surface of the first conductive adhesive film 160 attached to the back surface of the substrate 111 in the same direction as a formation direction of the first conductive adhesive film 160. A remaining portion (or another end) of the interconnector 120 not attached to the first conductive adhesive film 160 is electrically connected to the front electrode 113 or the front electrode current collector 114 of the adjacent solar cell 110.

A portion of each first conductive particle of the first conductive adhesive film 160 may be embedded in the interconnector 120 in a state where the substrate 111 is attached to the interconnector 120 using the first conductive adhesive film 160, in the same manner as the first and second example configurations.

The thickness T1 of the first conductive adhesive film 160 may be equal to or slightly greater than the thickness T4 of the back electrode 116 (i.e., T1≥T4).

The second width W3 of the interconnector 120 may be substantially equal to or greater than a width W8 of the space G2 (i.e., W3≥W8). An example where the second width W3 of the interconnector 120 is greater than the width W8 of the space G2 is illustrated by the dotted line shown in FIG. 25.

As above, when the second width W3 of the interconnector 120 is greater than the width W8 of the space G2, a portion of the interconnector 120 may contact a portion of the electrode part 116e if the thickness T1 of the first conductive adhesive film 160 is equal to the thickness T4 of the back electrode 116.

However, as shown in FIG. 26, when the thickness T1 of the first conductive adhesive film 160 is greater than the thickness T4 of the back electrode 116, the first conductive adhesive film 160 may be attached to a portion of the electrode part 116e during the tabbing process. Therefore, in this instance, the interconnector 120, or a portion thereof, does not directly contact the electrode part 116e, and the first conductive adhesive film 160 may be positioned between the interconnector 120 and the electrode part 116e.

Alternatively, as shown in FIG. 27, the thickness T1 of the first conductive adhesive film 160 may be less than the thickness T4 of the back electrode 116 (i.e., T1<T4).

As above, when the thickness T1 of the first conductive adhesive film 160 is less than the thickness T4 of the back electrode 116, the second width W3 of the interconnector 120 may be equal to or less than the width W8 of the space G2 (i.e., W3≤W8), so that the total area of the interconnector 120 sufficiently contacts the first conductive adhesive film 160.

The back electrode 116 including the electrode parts 116e may be manufactured using methods other than the above-described method.

For example, the back electrode 116 including the electrode parts 116e may be manufactured using a mask in which the space G2 is filled without performing a separate process for forming the space G2. However, in this instance, the back surface field layer 118 formed during the process for firing the conductive paste has the same pattern as the back electrode 116.

In other words, the back surface field layer 118 is formed in only a portion of the substrate 111, on which the electrode part 116e is positioned, and is not formed in a portion of the substrate 111 on which the space G2 is positioned. An example where the back surface field layer 118 is formed in only the portion of the substrate 111 on which the electrode part 116e is positioned is illustrated in FIG. 27.

In the structure shown in FIG. 27, carriers from the substrate 111 are transferred to the interconnector through the first conductive particles of the first conductive adhesive film 160. Thus, because the back electrode current collector may be omitted, the process and the cost required to form the back electrode current collector may be reduced.

Figure 28:
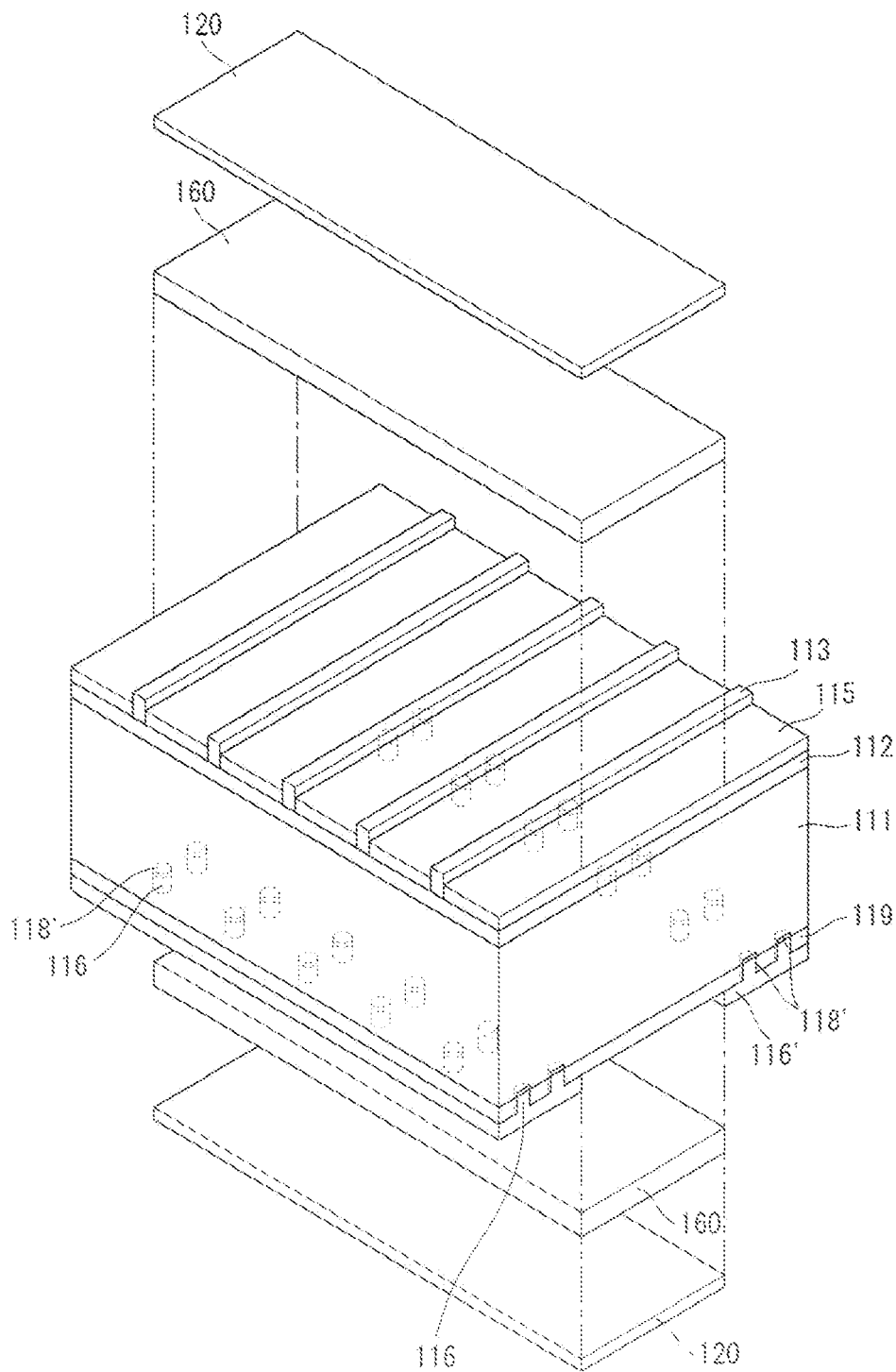
FIG. 28 is an exploded perspective view illustrating a fourth example configuration of a solar cell in the solar cell panel shown in FIG. 3.

FIG. 28 is an exploded perspective view illustrating a fourth example configuration of a solar cell in the solar cell panel shown in FIG. 3.

In the fourth example configuration of the solar cell panel, a passivation layer 119 is positioned on the back surface of the substrate 111, and a plurality of back electrode conductive layers 116' including the plurality of back electrodes 116 electrically connected to the substrate 111 are positioned on the passivation layer 119. A plurality of back surface field layers 118' are positioned between the back electrode conductive layers 116' and the substrate 111.

The passivation layer 119 on the back surface of the substrate 111 prevents or reduces a recombination and/or a disappearance of carriers around the surface of the substrate 111 and improves an internal reflectance of light passing through the substrate 111, thereby increasing a reincidence rate of light passing through the substrate 111. The passivation layer 119 has a single-layered structure or a multi-layered structure.

The back electrode conductive layers 116' are positioned at areas of the passivation layer 119 that does not have the first conductive adhesive film 160 attached thereto. The back electrode conductive layers 116' may be formed of a conductive material such as aluminum. Other materials may be used.

The back electrode conductive layers 116' pass through the passivation layer 119 and include the plurality of back electrodes electrically connected to a portion of the substrate 111.

As shown in FIG. 28, the plurality of back electrodes 116 are spaced from one another at a distance, which may be predetermined, for example, at a distance of about 0.5 mm to 1 mm. The back electrodes 116 may have various shapes such as a circle, an oval, and a polygon, for example, in cross section, and may be electrically connected to the substrate 111. Each of the back electrodes 116 may have a stripe shape extending in one direction in the same manner as the front electrode 113. The number of back electrodes 116 having the stripe shape is less than the number of back electrodes 116 having the shape such as the circle, the oval, and the polygon, but such is not required.

The back electrodes 116 collect carriers (for example, holes) moving to the substrate 111 and transfer the carries to the back electrode conductive layers 116'.

A portion of the back electrode 116 contacting the substrate 111 may contain only a formation material of the back electrode conductive layer 116' or may contain a formation material of the passivation layer 119 and a formation material of the substrate 111 as well as the formation material of the back electrode conductive layer 116'.

The back surface field layer 118' between the back electrode 116 and the substrate 111 is a region (e.g., a $p^+$-type region) that is more heavily doped than the substrate 111 with impurities of the same conductive type as the substrate 111.

When the back electrode 116 is electrically connected to the substrate 111 and has the stripe shape in the same manner as the front electrode 113, the back surface field layer 118' may have the stripe shape in the same manner as the back electrode 116.

The back electrode 116 and the back surface field layer 118' may be formed by forming the back electrode conductive layers 116' on the passivation layer 119, applying a laser beam in a predetermined area to form a molten mixture of the back electrode conductive layers 116', the passivation layer 119, and the substrate 111, and firing the substrate 111 at a temperature of about 750° C. to 800° C.

A back electrode current collector may be formed in a space between the back electrodes 116, i.e., on a back surface of the passivation layer 119 to which the first conductive adhesive film 160 is attached.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module, comprising:
    a plurality of solar cells, each solar cell including a substrate and an electrode part positioned at a surface of the substrate;
    an interconnector consisting of a conductive metal strip formed of a material containing an amount of lead (Pb) equal to or less than about 1,000 ppm, the interconnector lacking a solder coated on a surface of the conductive metal strip, and electrically connecting at least one of the plurality of solar cells to another of the plurality of solar cells; and
    a first conductive adhesive film including a first resin and a plurality of first conductive particles dispersed in the first resin, the first conductive adhesive film being positioned between the electrode part of the at least one of the plurality of solar cells and the interconnector to electrically connect the electrode part of the at least one of the plurality of solar cells to the interconnector,
    wherein a portion of at least one of the plurality of first conductive particles is embedded in the conductive metal strip of the interconnector,
    wherein a contact surface between the plurality of first conductive particles and the conductive metal strip is an uneven surface, and
    wherein the contact surface has the same surface shape as the portion of the at least one first conductive particle that is embedded in the conductive metal strip of the interconnector.

2. The solar cell module of claim 1, wherein the contact surface is a curved surface.

3. The solar cell module of claim 2, wherein the plurality of first conductive particles are formed of metal-coated resin particles with a metal containing at least one metal selected among copper (Cu), silver (Ag), gold (Au), iron (Fe), nickel (Ni), lead (Pb), zinc (Zn), cobalt (Co), titanium (Ti), and magnesium (Mg) as a main component.

4. The solar cell module of claim 1, wherein the plurality of first conductive particles are formed of metal particles containing at least one metal selected among copper (Cu), silver (Ag), gold (Au), iron (Fe), nickel (Ni), lead (Pb), zinc (Zn), cobalt (Co), titanium (Ti), and magnesium (Mg).

5. The solar cell module of claim 1, wherein a surface of the electrode part contacting the plurality of first conductive particles is a flat surface or an uneven surface having a plurality of uneven portions.

6. The solar cell module of claim 5, wherein the electrode part includes a plurality of front electrodes positioned at the surface of the substrate, and the first conductive adhesive film is positioned on the plurality of front electrodes in a direction crossing the plurality of front electrodes.

7. The solar cell module of claim 5, wherein the electrode part includes a plurality of front electrodes positioned at the surface of the substrate and a plurality of front electrode current collectors positioned to cross the plurality of front electrodes, and
    the first conductive adhesive film is positioned on the plurality of front electrode current collectors in a direction parallel to the plurality of front electrode current collectors.

8. The solar cell module of claim 5, further comprising a back electrode and a back electrode current collector that are positioned at a back surface opposite the surface of the substrate; and
    another first conductive adhesive film that contacts the back electrode current collector in a direction parallel to the back electrode current collector.

9. The solar cell module of claim 1, further comprising:
    a junction box;
    a lead wire configured to electrically connect the interconnector to the junction box; and
    a second conductive adhesive film positioned between the interconnector and the lead wire,
    wherein a contact surface between second conductive particles of the second conductive adhesive film, the interconnector, and the lead wire is an uneven surface.

10. The solar cell module of claim 9, wherein a portion of at least one of the second conductive particles is embedded in the conductive metal strip of the interconnector and the lead wire.

11. The solar cell module of claim 10, wherein the contact surface has the same surface shape as the portion of the at least one second conductive particle embedded in the conductive metal strip of the interconnector and the lead wire.

12. The solar cell module of claim 11, wherein the contact surface is a curved surface.

13. The solar cell module of claim 12, wherein the second conductive particles are formed of metal-coated resin particles with a metal containing at least one metal selected among copper (Cu), silver (Ag), gold (Au), iron (Fe), nickel (Ni), lead (Pb), zinc (Zn), cobalt (Co), titanium (Ti), and magnesium (Mg) as a main component.

14. The solar cell module of claim 13, wherein the lead wire includes a conductive metal strip that is formed of a material containing an amount of lead (Pb) equal to or less than about 1,000 ppm, and a solder that is coated on a surface of the conductive metal strip of the lead wire using a material containing lead.

15. The solar cell module of claim 13, wherein the lead wire consists of a conductive metal strip formed of a material containing an amount of lead (Pb) equal to or less than about 1,000 ppm.

16. The solar cell module of claim 11, wherein the second conductive particles are formed of metal particles containing at least one metal selected among copper (Cu), silver (Ag), gold (Au), iron (Fe), nickel (Ni), lead (Pb), zinc (Zn), cobalt (Co), titanium (Ti), and magnesium (Mg).

17. The solar cell module of claim 16, wherein the lead wire includes a conductive metal strip that is formed of a material containing an amount of lead (Pb) equal to or less than about 1,000 ppm, and a solder that is coated on a surface of the conductive metal strip of the lead wire using a material containing lead.

18. The solar cell module of claim 16, wherein the lead wire consists of a conductive metal strip formed of a material containing an amount of lead (Pb) equal to or less than about 1,000 ppm.

19. The solar cell module of claim 10, wherein each width of the portion of the at least one second conductive particle embedded in the conductive metal strip of the interconnector and the lead wire is equal to or less than about 2 μm.

20. The solar cell module of claim 1, wherein only the conductive metal strip of the interconnector electrically connects the at least one of the plurality of solar cells to the another of the plurality of solar cells.

* * * * *